(12) United States Patent
Kanamitsu et al.

(10) Patent No.: US 9,377,682 B2
(45) Date of Patent: Jun. 28, 2016

(54) TEMPLATE SUBSTRATE, METHOD FOR MANUFACTURING SAME, AND TEMPLATE

(75) Inventors: Shingo Kanamitsu, Kanagawa-ken (JP); Masamitsu Itoh, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 13/423,043

(22) Filed: Mar. 16, 2012

(65) Prior Publication Data

US 2013/0001753 A1    Jan. 3, 2013

(30) Foreign Application Priority Data

Jun. 30, 2011 (JP) .................... 2011-146473

(51) Int. Cl.
| H01L 29/06 | (2006.01) |
| H01L 21/30 | (2006.01) |
| G03F 7/00 | (2006.01) |
| B82Y 10/00 | (2011.01) |
| B82Y 40/00 | (2011.01) |

(52) U.S. Cl.
CPC .............. G03F 7/0002 (2013.01); B82Y 10/00 (2013.01); B82Y 40/00 (2013.01)

(58) Field of Classification Search
USPC ............ 257/623, 368, 305; 438/401; 425/385
See application file for complete search history.

(56) References Cited

U.S. PATENT DOCUMENTS

| 4,479,830 A | * | 10/1984 | Koshino et al. ............... 438/528 |
| 5,800,877 A | * | 9/1998 | Maeda et al. .................. 427/535 |
| 5,807,770 A | * | 9/1998 | Mineji .......................... 438/151 |
| 6,534,378 B1 | * | 3/2003 | Ramkumar et al. ........... 438/401 |
| 6,939,777 B2 | * | 9/2005 | Ohto et al. .................... 438/401 |
| 8,193,591 B2 | * | 6/2012 | Green et al. ................... 257/401 |
| 8,415,010 B2 | * | 4/2013 | Liu ........................ B82Y 10/00 428/336 |
| 2003/0118309 A1 | * | 6/2003 | Uno ............................. 385/129 |
| 2008/0073654 A1 | * | 3/2008 | Miyake et al. .................. 257/79 |
| 2008/0131623 A1 | | 6/2008 | Zhang et al. |
| 2009/0324173 A1 | * | 12/2009 | Asghari ......................... 385/52 |
| 2010/0092599 A1 | | 4/2010 | Selinidis et al. |
| 2011/0086472 A1 | * | 4/2011 | Yamazaki et al. ............. 438/151 |
| 2011/0183027 A1 | * | 7/2011 | Miller et al. .................. 425/385 |

(Continued)

FOREIGN PATENT DOCUMENTS

| JP | 3-274718 | 12/1991 |
| JP | 2004-214568 | 7/2004 |
| JP | 2007-506281 | 3/2007 |

(Continued)

OTHER PUBLICATIONS

Notification of Comments issued by the Korean Patent Office on Apr. 4, 2013, for Korean Patent Application No. 10-2012-26627, and English-language translation thereof.

(Continued)

*Primary Examiner* — Bradley K Smith
*Assistant Examiner* — David Goodwin
(74) *Attorney, Agent, or Firm* — Finnegan, Henderson, Farabow, Garrett & Dunner LLP

(57) ABSTRACT

According to one embodiment, a template substrate includes a substrate and a mask. The substrate includes a mesa region formed in a central portion of an upper surface of the substrate. The mesa region is configured to protrude more than a region of the substrate around the mesa region. An impurity is introduced into an upper layer portion of a partial region of a peripheral portion of the mesa region. The mask film is provided on the upper surface of the substrate.

19 Claims, 22 Drawing Sheets

(56) References Cited

U.S. PATENT DOCUMENTS

2011/0284966 A1* 11/2011 Wen et al. .................. 257/368
2011/0290134 A1* 12/2011 Itoh .................. H01L 21/0274
                                                        101/453

FOREIGN PATENT DOCUMENTS

| JP | 2009-96191 | 5/2009 |
| JP | 2009-298041 | 12/2009 |
| JP | 2010-34584 | 2/2010 |
| KR | 10-0937352 | 1/2010 |
| TW | 200620407 | 6/2006 |
| TW | 201035696 A1 | 10/2010 |
| WO | WO 2011/064020 A1 | 6/2011 |

OTHER PUBLICATIONS

Notification of Reason(s) for Refusal issued by the Japanese Patent Office on Oct. 30, 2015, for Japanese Patent Application No. 2012-059169, and English-language translation thereof.
Decision of Refusal issued by the Japanese Patent Office on Apr. 1, 2015, for Japanese Patent Application No. 2012-059169, and English-language translation thereof.
Notification of the Examination Opinion issued by the Taiwanese Patent Office on Aug. 22, 2014, for Taiwanese Patent Application No. 101108933, and English-language translation thereof.
Notification of Reason(s) for Refusal issued by Japanese Patent Office on Oct. 30, 2014, for Japanese Patent Application No. 2012-059169, and English-language translation thereof.
Notification of Reason(s) for Refusal issued by the Japanese Patent Office on Jan. 8, 2016, for Japanese Patent Application No. 2015-131937, and English-language translation thereof.

* cited by examiner

TEMPLATE SUBSTRATE, METHOD FOR MANUFACTURING SAME, AND TEMPLATE

CROSS-REFERENCE TO RELATED APPLICATIONS

This application is based upon and claims the benefit of priority from the prior Japanese Patent Application No. 2011-146473, filed on Jun. 30, 2011; the entire contents of which are incorporated herein by reference.

FIELD

Embodiments described herein relate generally to a template substrate and a method for manufacturing same.

BACKGROUND

Conventionally, photolithography has been used to manufacture semiconductor devices. However, as semiconductor devices are downscaled, the resolution of photolithography is becoming insufficient and pattern formation is becoming difficult. Therefore, in recent years, nanoimprinting is beginning to be used instead of photolithography.

In nanoimprinting, a template for nanoimprinting is constructed by making an unevenness in the surface of a quartz substrate by selectively removing the surface of the quartz substrate to form alignment marks for alignment and a pattern (a device pattern) which is an inverted pattern of the resist pattern to be formed on the semiconductor substrate. Then, an ultraviolet-curing resist material is coated onto the semiconductor substrate to be patterned; and the template is pressed onto the resist material. Continuing, the resist material is cured by irradiating ultraviolet through the template onto the resist material while the template is pressed. Thus, the resist pattern is formed by the device pattern of the template being transferred onto the resist material. Because nanoimprinting has few causes of fluctuation such as the depth of focus, aberration, exposure amount, etc., that are problematic in conventional photolithography, many resist patterns can be formed exceedingly easily and with good precision by constructing one template.

However, the manufacturing of semiconductor devices includes processes in which a new pattern is formed on a substrate on which a pattern is already formed. In the case where nanoimprinting is used in such a process, it is necessary for the alignment of the template with respect to the substrate to have high precision. Such alignment is performed by overlaying the alignment marks formed in the template and the alignment marks formed on the substrate while viewing with visible light.

However, because the refractive index with respect to visible light of quartz which is the material of the template is substantially equal to the refractive index with respect to visible light of the ultraviolet-curing resist material, the alignment marks can no longer be seen when the template is pressed onto the resist material and the resist material enters the recesses of the alignment marks. Therefore, the alignment unfortunately cannot be performed with sufficient precision.

DETAILED DESCRIPTION

In general, according to one embodiment, a template substrate includes a substrate and a mask. The substrate includes a mesa region formed in a central portion of an upper surface of the substrate. The mesa region is configured to protrude more than a region of the substrate around the mesa region.

An impurity is introduced into an upper layer portion of a partial region of a peripheral portion of the mesa region. The mask film is provided on the upper surface of the substrate.

In general, according to one embodiment, a method for manufacturing a template substrate includes: setting an impurity implantation region including a region where an alignment mark is to be formed in a substrate based on information of the alignment mark, the substrate including a mesa region in a central portion of an upper surface of the substrate, the mesa region being configured to protrude more than a region of the substrate around the mesa region; designating a position of the impurity implantation region of the substrate using a corner of the mesa region, two mutually adjacent end edges of the mesa region or a reference pattern formed outside of the mesa region as a reference, and implanting an impurity into the designated impurity implantation region; and forming a mask film on the upper surface of the substrate.

In general, according to one embodiment, a method for manufacturing a template substrate includes: setting an impurity implantation region including a region where an alignment mark is to be formed in a substrate based on information of the alignment mark, the substrate having a flat plate configuration; designating a position of the impurity implantation region of the substrate using a corner of the substrate, two mutually adjacent end edges of the substrate or a reference pattern as a reference, and implanting an impurity into the designated impurity implantation region; removing an upper layer portion of the substrate in a region of the substrate around a region including the impurity implantation region; and forming a mask film on an upper surface of the substrate.

Embodiments of the invention will now be described with reference to the drawings.

First, a first embodiment will be described.

Figure 1A:
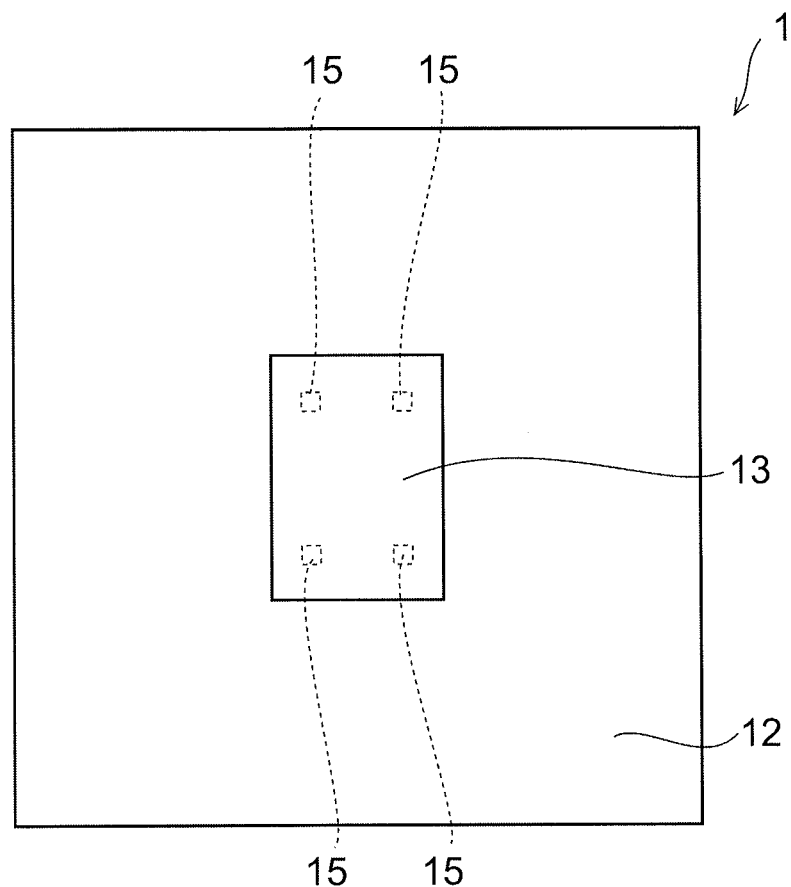
FIG. 1A is a plan view illustrating a template substrate according to a first embodiment.
Figure 1B:
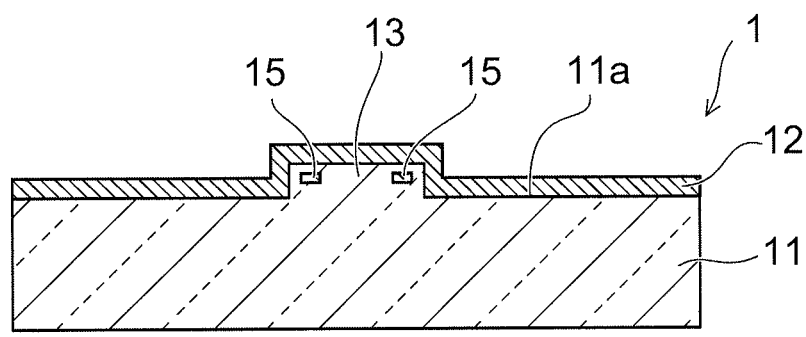
FIG. 1B is a cross-sectional view of the template substrate.

FIG. 1A is a plan view illustrating a template substrate according to the embodiment; and FIG. 1B is a cross-sectional view of FIG. 1A.

Figure 2:
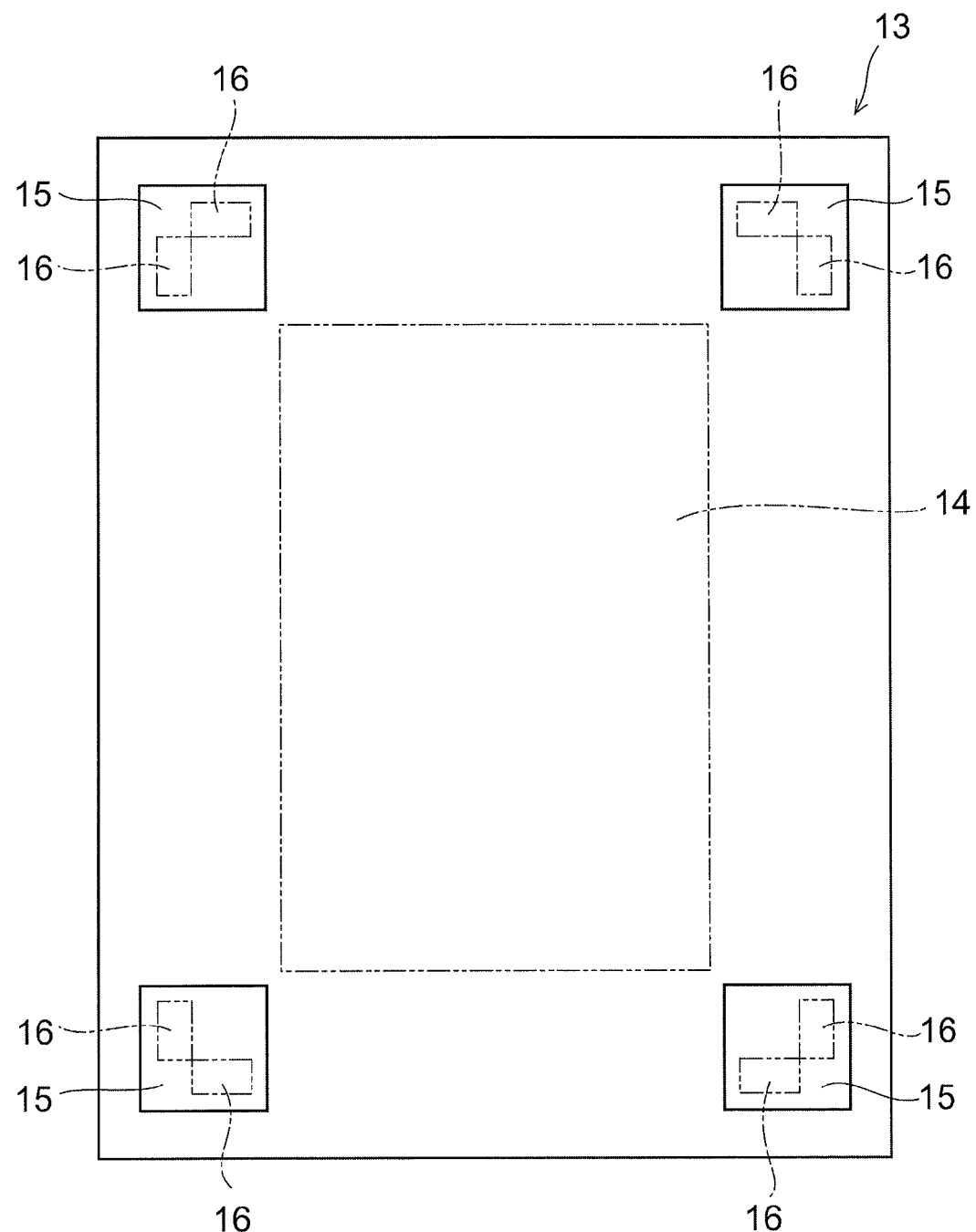
FIG. 2 is a plan view illustrating a mesa region of the template substrate according to the first embodiment.

FIG. 2 is a plan view illustrating a mesa region of the template substrate according to the embodiment.

Figure 3A:
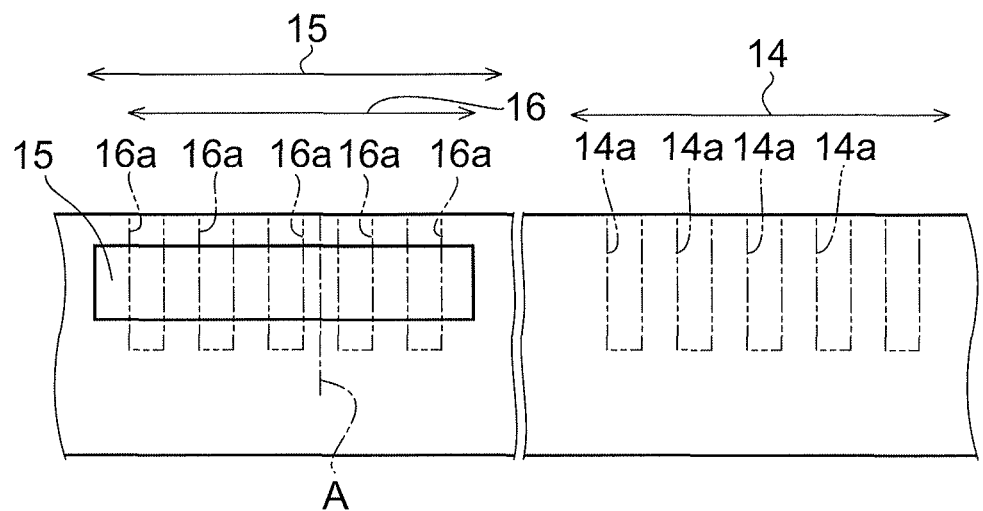
FIG. 3A is a cross-sectional view illustrating the mesa region of the template substrate according to the first embodiment and FIG. 3B is a graph illustrating an impurity concentration profile along the straight line A illustrated in FIG. 3A, where the vertical axis illustrates the distance from the substrate surface, and the horizontal axis illustrates the impurity concentration.
Figure 3B:
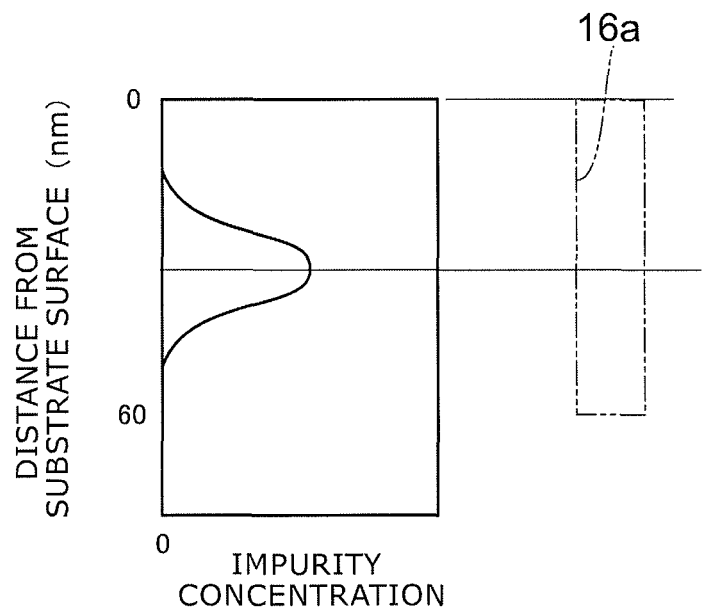

FIG. 3A is a cross-sectional view illustrating the mesa region of the template substrate according to the embodiment. FIG. 3B is a graph illustrating an impurity concentration profile along the straight line A illustrated in FIG. 3A, where the vertical axis illustrates the distance from the substrate surface, and the horizontal axis illustrates the impurity concentration.

The mask film 12 is not illustrated in FIG. 2.

In FIG. 3B, a trench 16a also is shown to illustrate the positional relationship between the impurity concentration profile and the trench 16a.

These drawings are schematic; and the dimensional ratios and the vertical:horizontal ratios of portions do not necessarily match those of an actual template substrate. This is similar for other drawings described below.

In a template substrate 1 according to the embodiment as illustrated in FIGS. 1A and 1B, a substrate 11 made of quartz is provided; and the mask film 12 is provided on an upper surface 11a of the substrate 11. The substrate 11 has a substantially rectangular plate configuration. A mesa region 13 is formed in the central portion of the upper surface 11a of the substrate 11 to protrude more than the region of the substrate 11 around the mesa region 13. The configuration of the mesa region 13 is a rectangle as viewed from above. The upper surface of the mesa region 13 of the upper surface 11a of the substrate 11 is parallel to the upper surface of the region of the substrate 11 other than the mesa region 13. The mask film 12 is a thin film including a metal, e.g., a chromium nitride film.

In one example of the dimensions, the substrate 11 is a square having a longitudinal length and a lateral length of 152 mm (millimeters) each as viewed from above with a thickness of 6.35 mm. The mesa region 13 is a rectangle having one side with a length of 26 mm and the other side with a length of 33 mm as viewed from above with a height of 30 μm (microns). The film thickness of the mask film 12 is, for example, 5 to 10 nm (nanometers).

As illustrated in FIG. 2, a device region 14, which is a region where a device pattern is to be formed, is set in the central portion of the mesa region 13. The device pattern is not formed in the template substrate 1 because the device pattern is formed when using the template substrate 1 to construct the template.

An impurity implantation region 15 is formed in the upper layer portion of a portion of the peripheral portion of the mesa region 13, i.e., a portion of the mesa region 13 around the device region 14. An impurity is introduced into the impurity implantation region 15. The impurity implantation region 15 is disposed at, for example, each of the corners of the mesa region 13. The impurity is, for example, gallium, xenon, antimony, argon, indium, silicon, arsenic, or lead. An alignment mark region 16, which is a region where the alignment mark is to be formed, is set in the interior of the impurity implantation region 15. The alignment mark also is not formed in the template substrate 1 and is formed, for example, simultaneously with the device pattern.

As illustrated in FIG. 3A, trenches 14a are made in the upper surface 11a of the substrate 11 in the device region 14 when the device pattern is formed in the template substrate 1. The multiple trenches 16a are made periodically to be parallel to each other in the upper surface 11a of the substrate 11 in the alignment mark region 16 when the alignment mark is formed. The depths of the trenches 16a and the trenches 14a are substantially equal to each other, e.g., 60 nm. The impurity implantation region 15 is positioned at the vertical-direction intermediate portion of the trenches 16a. In other words, when the trenches 16a are made, the trenches 16a pierce the impurity implantation region 15 in the vertical direction. Although the outer surface of the impurity implantation region 15 is not always something that can be specified by one definition, the impurity concentration profile of the impurity implantation region 15 along the vertical direction has a maximum value at a position higher than the position where the trench 16a bottom surface is to be formed as illustrated in FIG. 3B.

Normally, in the case of mass production of a semiconductor device by nanoimprinting, the two types of templates of a master template and a replica template are constructed. In the master template, a device pattern and alignment marks are formed by, for example, electron beam lithography in a quartz substrate having a flat plate configuration in which a mesa region is not formed. Normally, only one master template is manufactured. On the other hand, the replica template is manufactured by using the master template to transfer the device pattern and the alignment marks onto the template substrate where the mesa region described above is formed. The semiconductor device is manufactured by transferring the pattern of the replica template onto the semiconductor substrate. However, the replica template is a wearing part because the device pattern and the alignment pattern are gradually damaged by repeating the transfer onto the semiconductor substrate. Therefore, multiple replica templates are manufactured using the master template. The template substrate according to the embodiment is, for example, a substrate for forming a replica template.

A method for manufacturing the template substrate according to the embodiment will now be described.

Figure 4:
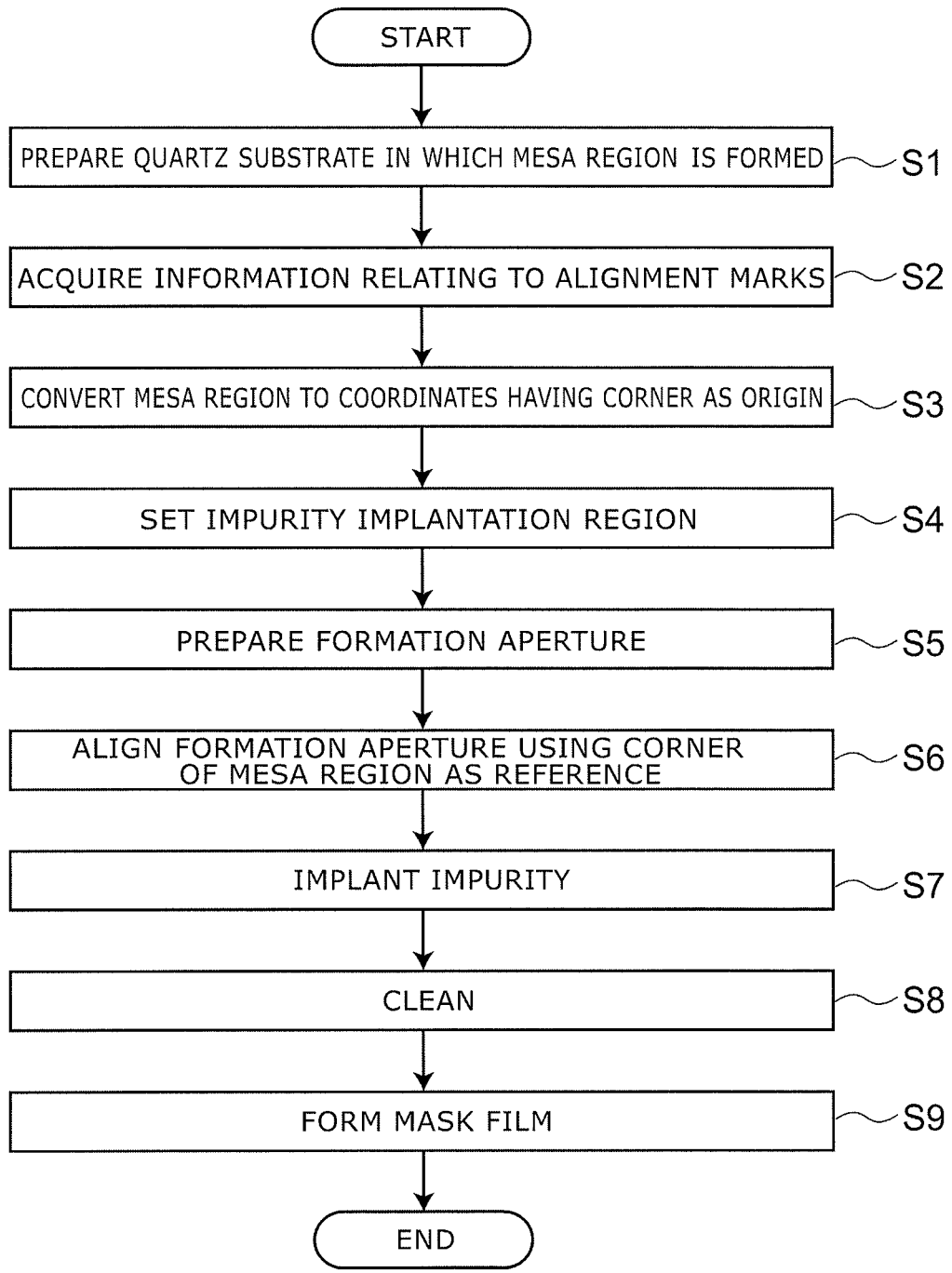
FIG. 4 is a flowchart illustrating the method for manufacturing the template substrate according to the first embodiment.

FIG. 4 is a flowchart illustrating the method for manufacturing the template substrate according to the embodiment.

Figure 5A:
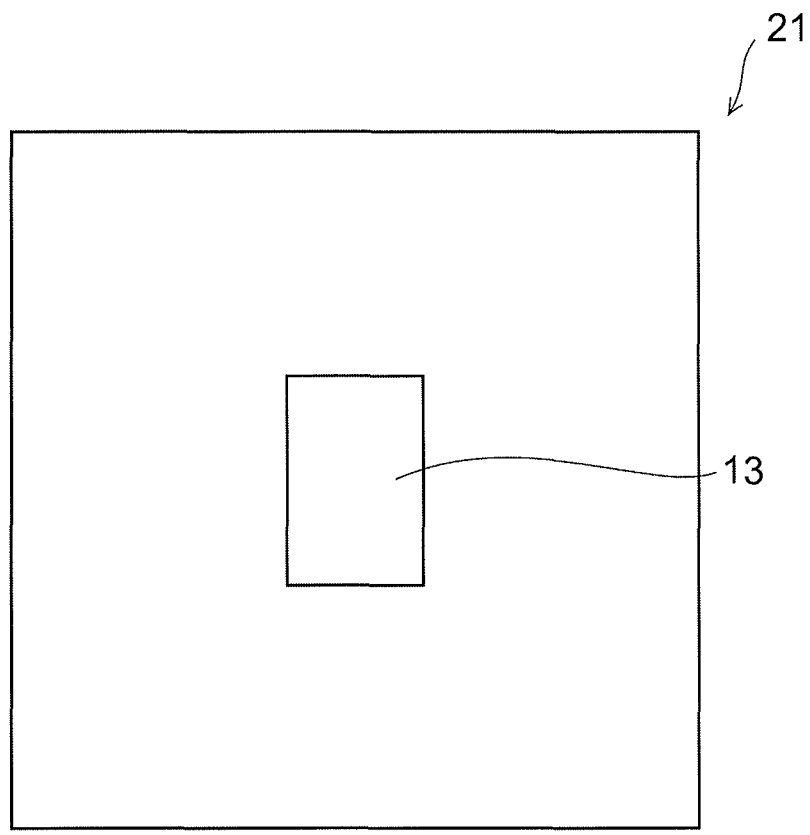
FIG. 5A is a plan view illustrating a quartz substrate.
Figure 5B:
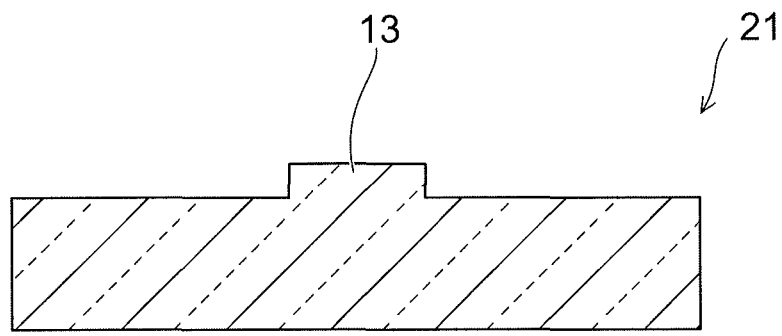
FIG. 5B is a cross-sectional view of the quartz substrate.

FIG. 5A is a plan view illustrating a quartz substrate; and FIG. 5B is a cross-sectional view of FIG. 5A.

Figure 6A:
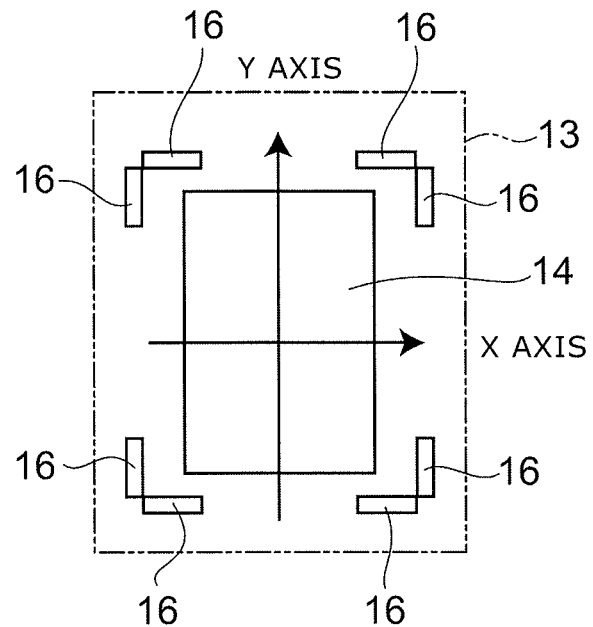
FIGS. 6A and 6B illustrate information relating to the alignment marks, wherein FIG. 6A uses an orthogonal coordinate system having the center of the template as an origin, and FIG. 6B uses an orthogonal coordinate system having the corner of the mesa region as an origin.
Figure 6B:
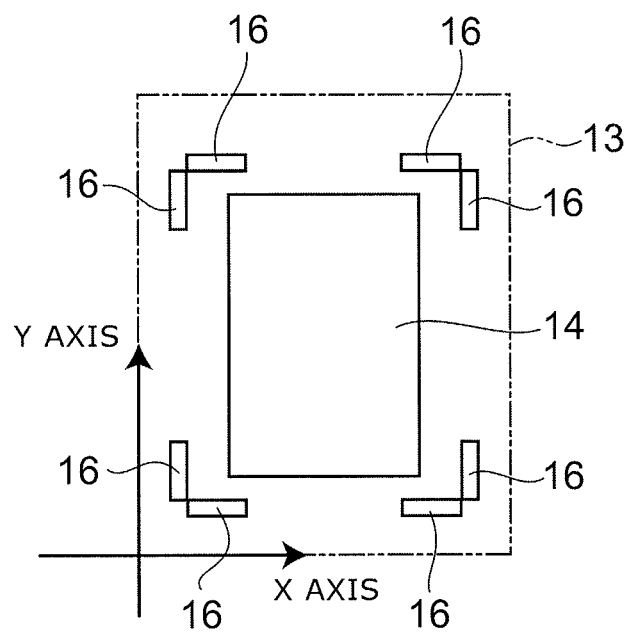

FIGS. 6A and 6B illustrate information relating to the alignment marks. FIG. 6A uses an orthogonal coordinate system having the center of the template as an origin; and FIG. 6B uses an orthogonal coordinate system having the corner of the mesa region as an origin.

Figure 7:
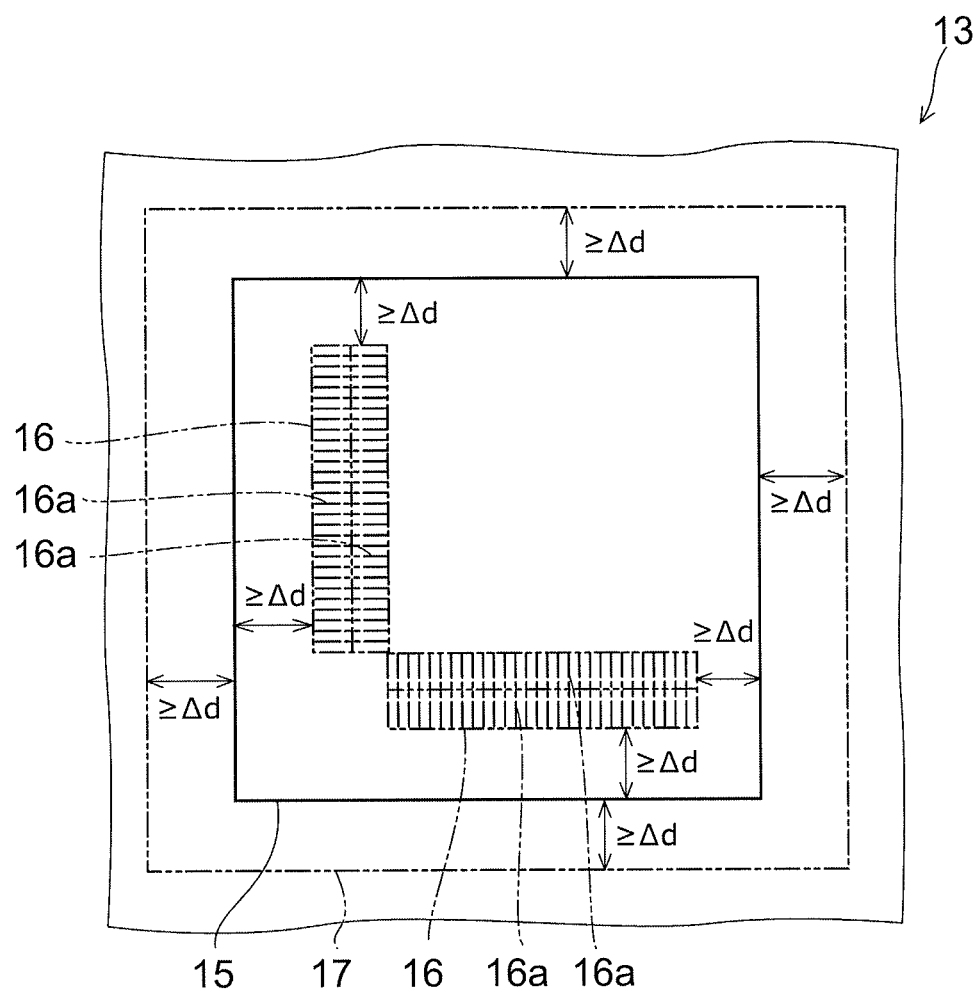
FIG. 7 is a plan view illustrating the relationship between the alignment mark region and the impurity implantation region of the first embodiment.

FIG. 7 is a plan view illustrating the relationship between the alignment mark region and the impurity implantation region of the embodiment.

Figure 8:
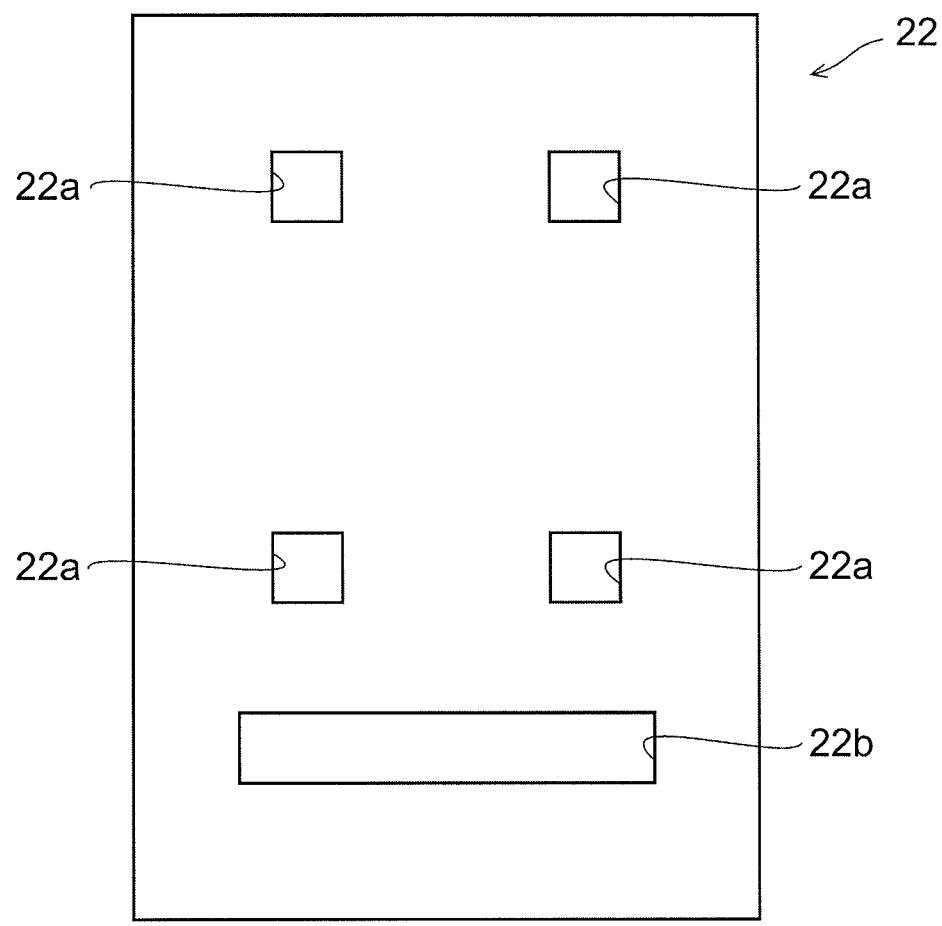
FIG. 8 is a plan view illustrating a formation aperture used in the first embodiment.

FIG. 8 is a plan view illustrating a formation aperture used in the embodiment.

Figure 9:
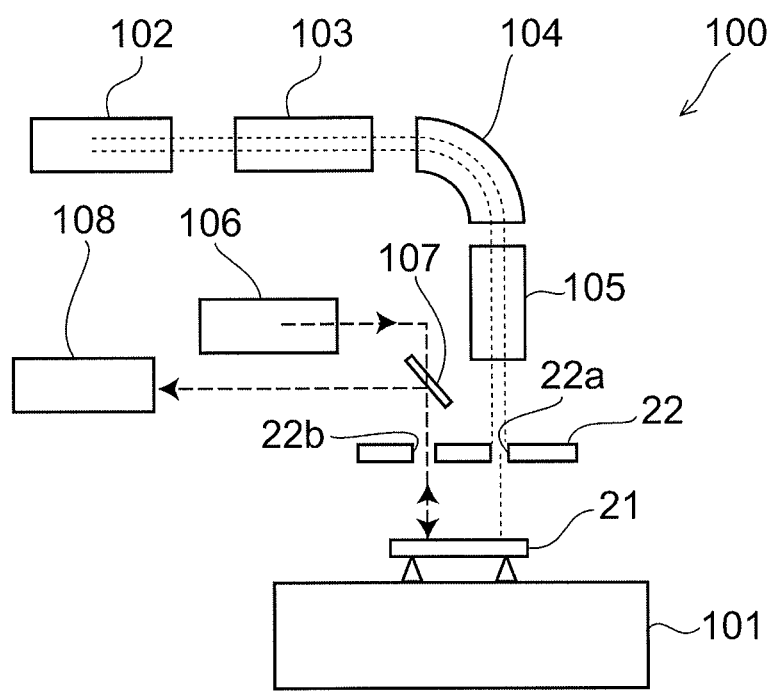
FIG. 9 illustrates an ion implantation method of the first embodiment.

FIG. 9 illustrates an ion implantation method of the embodiment.

Figure 10A:
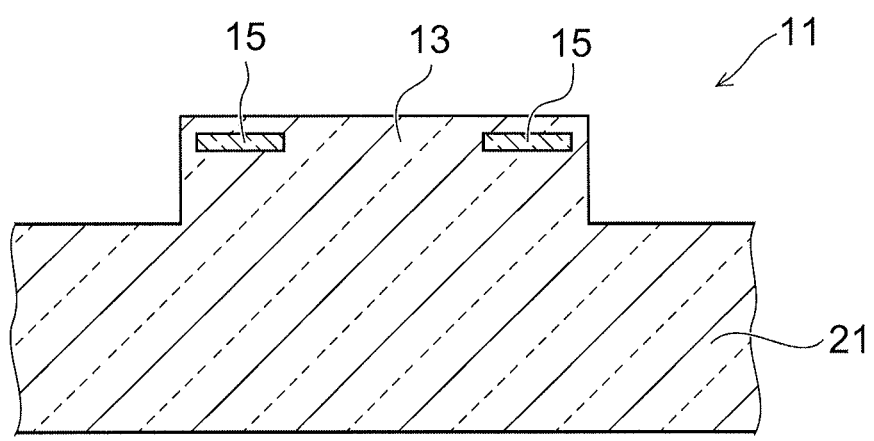
FIGS. 10A and 10B are cross-sectional views illustrating a method for manufacturing the template substrate according to the first embodiment.
Figure 10B:
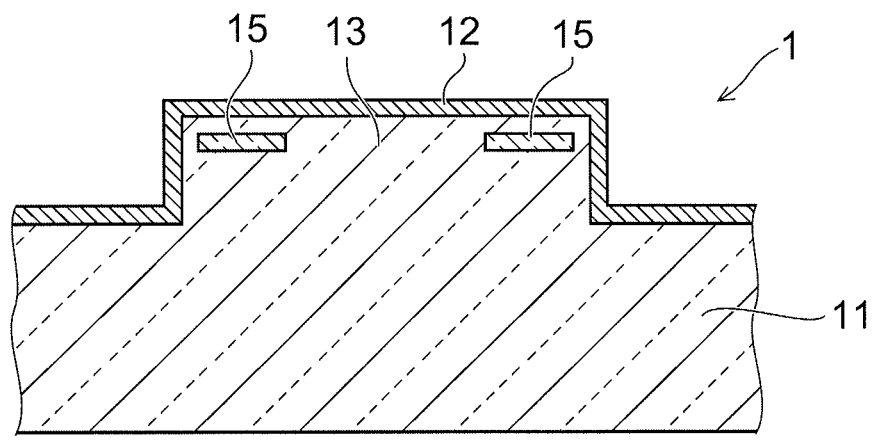

FIGS. 10A and 10B are cross-sectional views illustrating a method for manufacturing the template substrate according to the embodiment.

First, as illustrated in step S1 of FIG. 4 and FIGS. 5A and 5B, a quartz substrate 21 including the mesa region 13 formed in the central portion of the upper surface of the quartz substrate 21 is prepared. The quartz substrate 21 has a square substantially flat plate configuration having a longitudinal length and a lateral length of, for example, 152 mm each with a thickness of, for example, 6.35 mm. The mesa region 13 may be formed by performing wet etching using a hydrofluoric acid etchant in a state in which, for example, the region of the upper surface of the quartz plate having the flat plate configuration where the mesa region 13 is to be formed is covered with a resist film. The mesa region 13 has, for example, a rectangular configuration having a longitudinal length of 33 mm, a lateral length of 26 mm, and a height of, for example, 30 μm.

Then, as illustrated in step S2 of FIG. 4, the information relating to the alignment marks is acquired from the design information of the master template. Specifically, the information relating to the number, the positions, and the sizes of the alignment mark regions 16 is acquired. Normally, this information is in a data format that is utilizable in CAD (Computer Aided Design), e.g., GDS data, MEBES data, etc.

Normally, in such data formats, the positions and the like of the objects are defined using an orthogonal coordinate system having the center of the template as an origin as illustrated in FIG. 6A. Because this data is the design information of the master template, the information relating to the mesa region is not included.

Therefore, the information relating to the position and the size of the mesa region 13 is acquired. Then, the intersection of the diagonal lines of the mesa region in the data is imaginarily overlaid on the origin of the data relating to the alignment marks, i.e., the center of the template. Thereby, in the data, the alignment mark regions are disposed inside the mesa region.

Then, as illustrated in step S3 of FIG. 4 and FIG. 6B, an orthogonal coordinate system having the corner of the mesa region 13 as an origin is set. Continuing, the coordinate data of the alignment mark regions 16 is converted such that this orthogonal coordinate system becomes the reference. Thereby, the reference coordinates of each of the alignment mark regions 16 may be the coordinates of the corner that is most proximal to the origin and may be described as M1 (X1, Y1), M2 (X2,Y2), .... At this time, all of the parameters X1, X2, ..., Y1, Y2, ..., are relatively small positive numbers.

Continuing as illustrated in step S4 of FIG. 4 and FIG. 7, the impurity implantation region 15 is determined based on the positional information of the alignment mark region 16. First, an error Δd, i.e., the value of the positional shift amount, of the implantation position is acquired for an ion implantation apparatus 100 (referring to FIG. 9) used in the ion implantation of the impurity. The error Δd is the shift amount between the target position and the actual irradiated position when irradiating the ion beam and is a value that is statistically predicted for each ion implantation apparatus. The error Δd occurs, for example, due to the error during the alignment of the coordinates, the error during the alignment of the irradiation, and the like of the ion implantation apparatus. The impurity implantation region 15 is set to include the alignment mark region 16. The outer edge of the impurity implantation region 15 is set at a position separated from the outer edge of the alignment mark region 16 by a distance not less than the error Δd. Thereby, the impurity is reliably implanted into the alignment mark region 16 even in the case where the implantation position of the impurity is shifted within the range of the error Δd. In the embodiment, the configuration of the impurity implantation region 15 is a rectangle as viewed from above.

A closed figure is drawn to connect the points that are outside the impurity implantation region 15 and separated from the outer edge of the impurity implantation region 15 by a distance not less than the error Δd; and this closed figure is used as an alignment mark frame 17. For example, in the case where the error Δd is 0.5 μm, the alignment mark frame 17 is a figure having a longitudinal length and a lateral length that are each larger than those of the alignment mark region 16 by not less than 1 μm. The alignment mark frame 17 is an imaginary concept and does not correspond directly to a substantial component such as a trench, etc. In the embodiment, the configuration of the alignment mark frame 17 is a rectangle along the outer edge of the impurity implantation region 15.

Thus, by setting the alignment mark frame 17, the impurity is not implanted outside the alignment mark frame 17 even in the case where the implantation position is shifted within the range of the error Δd in the implantation process of the impurity described below. Therefore, the alignment mark frame 17 can be utilized as a boundary outside which the impurity is not implanted. Thus, the impurity can be reliably implanted into the interior of the alignment mark region 16; and the impurity can be reliably prevented from being implanted outside the alignment mark frame 17.

Then, as illustrated in step S5 of FIG. 4 and FIG. 8, a formation aperture 22 corresponding to the impurity implantation regions 15 determined in step S4 is prepared. The formation aperture 22 is a mask used when performing ion implantation of the impurity into the quartz substrate 21. A viewing window 22b is made in the formation aperture 22 in addition to openings 22a corresponding to the impurity implantation regions 15. The positional relationship between the openings 22a and the viewing window 22b is ascertained beforehand.

Continuing as illustrated in step S6 of FIG. 4 and FIG. 9, the formation aperture 22 and the quartz substrate 21 are mounted in the ion implantation apparatus 100; and alignment is performed.

The configuration of the ion implantation apparatus 100 will now be described briefly.

An XY stage 101 that is capable of alignment is provided in the ion implantation apparatus 100. The quartz substrate 21 is mounted on the XY stage 101 by a sample holder (not illustrated).

An ion source chamber 102, an acceleration mechanism 103, a mass-analyzing magnet 104, and a beam optical system 105 are provided above the XY stage 101 to form a path of the impurity ions. Then, the formation aperture 22 is disposed between the beam optical system 105 and the XY stage 101 to be provided in the path of the impurity ions.

A viewing light source 106 also is provided above the formation aperture 22. The viewing light source 106 is disposed at a position such that the viewing light emitted from the viewing light source 106 reaches the XY stage 101 via the viewing window 22b of the formation aperture 22. A half mirror 107 is provided in the path of the viewing light. A CCD (Charge Coupled Device) camera 108 is provided at a position such that the light reflected by the half mirror 107 is incident on the CCD camera 108.

The alignment method between the formation aperture 22 and the quartz substrate 21 will now be described.

First, the viewing light source 106 is caused to emit the viewing light. The viewing light passes through the half mirror 107, passes through the viewing window 22b of the formation aperture 22, and reaches the quartz substrate 21 or the XY stage 101. Then, the viewing light reflected by the quartz substrate 21 or the XY stage 101 again passes through the viewing window 22b, is reflected by the half mirror 107, and is incident on the CCD camera 108. Thereby, the quartz substrate 21 or the XY stage 101 can be viewed by the CCD camera 108. Then, the position of the quartz substrate 21 is adjusted by operating the XY stage 101 such that a corner or two mutually adjacent end edges of the mesa region 13 of the quartz substrate 21 is positioned in the viewing region.

Then, the tilt of the end edge of the mesa region 13 is detected; and the X axis and the Y axis of the coordinate system set in step S3 of FIG. 4 are aligned with the X axis and the Y axis of the coordinate system of the XY stage 101. Then, the corner of the mesa region used as the origin of the coordinate system in step S3 is caused to match the reference point of the coordinate system of the XY stage 101. Subsequently, the quartz substrate 21 is positioned to implant the impurity ions into the impurity implantation regions 15 by further driving the XY stage 101 based on the reference coordinates M1 (X1, Y1), M2 (X2, Y2), . . . , of the alignment mark regions 16. Thus, the alignment is completed.

Continuing as illustrated in step S7 of FIG. 4 and FIG. 9, the impurity ions are selectively implanted into the quartz substrate 21. For example, in the case where gallium is used as the impurity, liquid gallium is set inside the ion source chamber 102; and an extracting voltage is applied to the acceleration mechanism 103 while heating the liquid gallium. Thereby, gallium ions are extracted from the ion source chamber 102 and accelerated by the acceleration mechanism 103. Then, the purity of the gallium ions is increased by passing through the mass-analyzing magnet 104; and the gallium ions are configured into a parallel beam by the beam optical system 105. The gallium ion beam is formed in a configuration corresponding to the impurity implantation regions 15 by passing through the four openings 22a made in the formation aperture 22 and is irradiated toward the quartz substrate 21. In one example, the dose is $2 \times 10^{16}$ to $4 \times 10^{16}$ ions/cm$^2$ and the acceleration voltage is not more than 50 kV. In such a case, the impurity is implanted into the regions with a shallow depth of not more than 60 nm. Thereby, as illustrated in FIG. 10A, the impurity implantation regions 15 are formed in the quartz substrate 21. As a result, the substrate 11 is constructed.

Then, as illustrated in step S8 of FIG. 4, the substrate 11 is cleaned to remove particles adhered to the surface and the contamination that adhered due to the implantation of the impurity ions.

Continuing as illustrated in step S9 of FIG. 4 and FIG. 10B, the mask film 12 is formed by, for example, depositing chromium nitride on the upper surface of the substrate 11 by sputtering with, for example, a thickness of 5 to 10 nm. Thus, the template substrate 1 illustrated in FIG. 1A to FIG. 3B is manufactured.

A method for manufacturing a replica template using the template substrate according to the embodiment will now be described.

Figure 11:
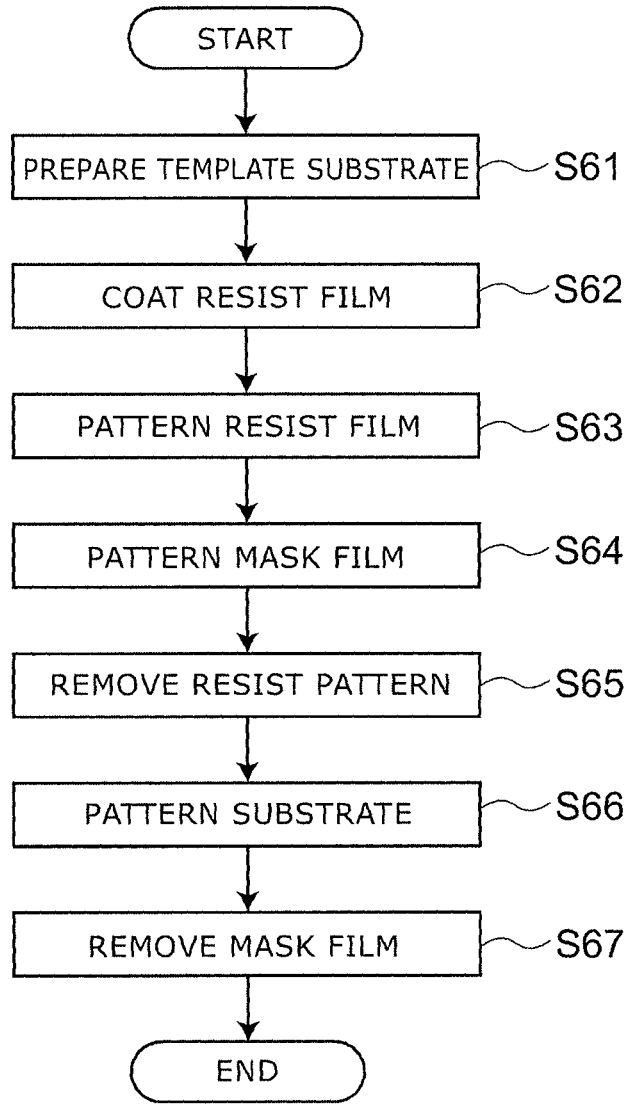
FIG. 11 is a block diagram illustrating the method for manufacturing the replica template of the first embodiment.

FIG. 11 is a block diagram illustrating the method for manufacturing the replica template of the embodiment.

FIGS. 12A to 12G are cross-sectional views of processes, illustrating the method for manufacturing the replica template of the embodiment.

Figure 12A:
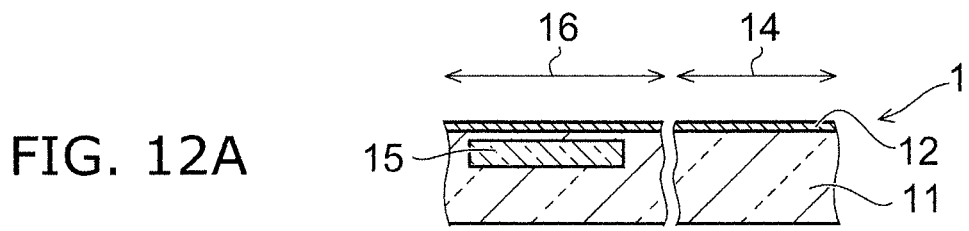
FIGS. 12A to 12G are cross-sectional views of processes, illustrating the method for manufacturing the replica template of the first embodiment.

First, as illustrated in step S61 of FIG. 11 and FIG. 12A, the template substrate 1 according to the embodiment is prepared. As described above, the device region 14 and the alignment mark regions 16 are set in the template substrate 1.

Figure 12B:
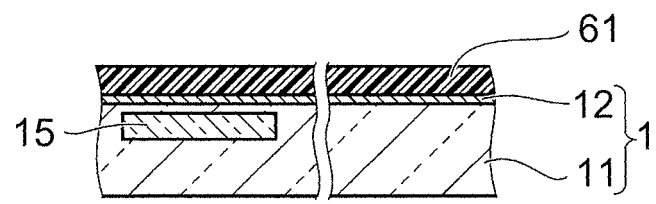

Then, as illustrated in step S62 of FIG. 11 and FIG. 12B, an ultraviolet-curing resist film 61 is coated onto the entire surface of the upper surface of the template substrate 1.

Figure 12C:
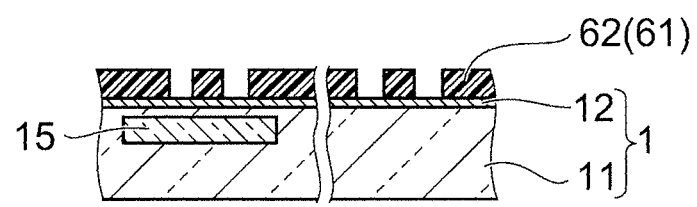

Continuing as illustrated in step S63 of FIG. 11 and FIG. 12C, the coated resist film 61 in the mesa region 13 is caused to deform by pressing a master template (not illustrated) onto the template substrate 1. In this state, the resist film 61 is cured by, for example, irradiating ultraviolet of a wavelength of 365 nm. As a result, a resist pattern 62 is formed. At this time, the device pattern and the alignment marks are formed in the resist pattern 62. Subsequently, the master template is peeled from the template substrate 1 and the resist pattern 62.

Figure 12D:
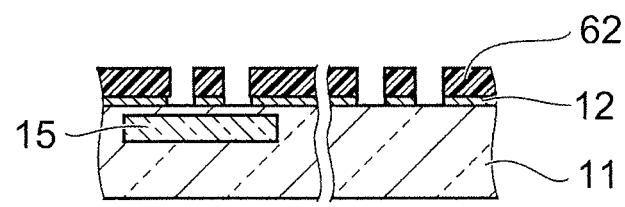

Then, as illustrated in step S64 of FIG. 11 and FIG. 12D, dry etching is performed using an etching gas including chlorine with the resist pattern 62 as a mask. Thereby, the pattern of the resist pattern 62 is transferred by etching the mask film 12 made of chromium nitride.

Figure 12E:
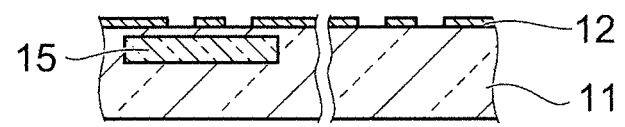

Continuing as illustrated in step S65 of FIG. 11 and FIG. 12E, the resist pattern 62 is removed.

Figure 12F:
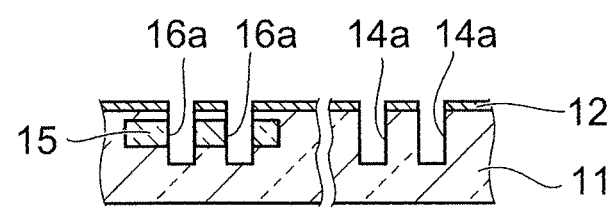

Then, as illustrated in step S66 of FIG. 11 and FIG. 12F, dry etching is performed using an etching gas including fluorine with the patterned mask film 12 as a mask. Thereby, the trenches 14a are made in the device region 14 and the trenches 16a are made in the alignment mark region 16 by the substrate 11 made of quartz being etched. The trenches 14a and the trenches 16a are made to be deeper than the lower surface of the impurity implantation regions 15, e.g., to a depth of 60 nm. Thereby, the trenches 16a pierce the impurity implantation regions 15. The device pattern includes the trenches 14a; and the alignment marks include the trenches 16a.

Figure 12G:
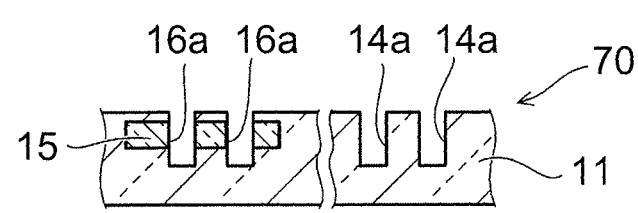

Continuing as illustrated in step S67 of FIG. 11 and FIG. 12G, the mask film 12 is removed by performing wet etching using cerium nitrate. Thereby, a replica template 70 is constructed.

Then, the semiconductor device is manufactured by implementing nanoimprinting using the replica template 70. For example, a resist pattern is formed on a semiconductor substrate by coating an ultraviolet-curing resist material (not illustrated) onto a semiconductor substrate (not illustrated) such as a silicon wafer, etc., and irradiating ultraviolet in a state in which the replica template 70 is pressed onto the resist material. At this time, the alignment between the replica template 70 and the semiconductor substrate is performed by overlaying the alignment marks formed in the replica template 70 and the alignment marks formed in the semiconductor substrate and by viewing the alignment marks using white light of a wavelength of, for example, about 530 nm. Although these alignment marks each have a pattern in which multiple trenches are arranged periodically, the periods are slightly different from each other. Therefore, a moiré pattern occurs when the two marks are overlaid; and the position of the moiré pattern changes as the relative positional relationship of the two marks changes. Thereby, the relative positional relationship of the two marks can be amplified and detected; and the alignment of the replica template 70 with respect to the semiconductor substrate can be performed with high precision. As illustrated in FIG. 7, the alignment can be performed in two mutually orthogonal directions by two types of alignment marks being formed in both the replica template 70 and the semiconductor substrate such that the directions in which the trenches extend are orthogonal to each other.

Then, processing is performed on the semiconductor substrate using the resist pattern as a mask. This processing may be, for example, etching or the implantation of an impurity. For example, in the case where the semiconductor substrate is a silicon wafer, trenches are made by selectively removing the upper layer portion of the semiconductor substrate by performing dry etching using the resist pattern as a mask. Or, an impurity diffusion layer is formed in the upper layer portion of the semiconductor substrate by selectively implanting an impurity using the resist pattern as a mask. Or, in the case where the semiconductor substrate includes an insulating film and a conductive film formed on a silicon wafer, dry etching using the resist pattern as a mask is performed to make a trench or a hole in the insulating film and pattern the conductive film into interconnects. Thus, the semiconductor device is manufactured.

Operational effects of the embodiment will now be described.

In the replica template 70 according to the embodiment, the impurity implantation regions 15 are formed in the substrate 11 made of quartz; and the trenches 16a are made to pierce the impurity implantation regions 15. Accordingly, an impurity, e.g., gallium, is implanted into the portion of the substrate 11 between the trenches 16a. Therefore, the refractive index with respect to visible light of the substrate 11 made of quartz in the alignment mark regions 16 is higher than that of the case where the impurity is not contained. The transmittance with respect to visible light also changes. As a result, the difference between the refractive index of the portion between the trenches 16a in the replica template 70 and the refractive index of the ultraviolet-curing resist material increases. On the other hand, the impurity is not implanted into the bottom surfaces of the trenches 16a because the trenches 16a extend through the impurity implantation regions 15. Therefore, the alignment marks can be optically detected easily even after the alignment marks contact the resist material. As a result, the alignment of the replica template 70 with respect to the semiconductor substrate can be performed with high precision.

Conversely, if the impurity is not contained in the alignment mark regions, the contrast of the alignment pattern decreases after the alignment marks contact the resist material and it becomes difficult to optically detect the alignment marks because the refractive index of the quartz is substantially equal to the refractive index of the resist material in the wavelength region of the light used in the alignment. Therefore, in the process of pressing the replica template onto the resist material, it is necessary to end the alignment prior to the replica template contacting the resist material and to subsequently press the replica template onto the resist material without the position shifting as much as possible. However, positional shifting unavoidably occurs in the pressing process because the replica template is moved vertically. Therefore, it is difficult to obtain sufficient alignment precision at the point in time when the pressing of the replica template ends; and this causes the manufacturing yield of the semiconductor device to decrease. Although the alignment precision is 8 to 10 nm in one example in which a replica template that does not contain the impurity is used, an alignment precision of 6 nm can be realized according to the embodiment. In the case where a pattern having a half pitch of 22 nm is formed, the permissible alignment precision is about 7 nm.

In the process illustrated in step S4 of FIG. 4 and FIG. 7 in the embodiment, the impurity implantation region 15 and the alignment mark frame 17 are determined by considering the error Δd expected when implanting the impurity. Effects thereof will now be described.

Figure 13:
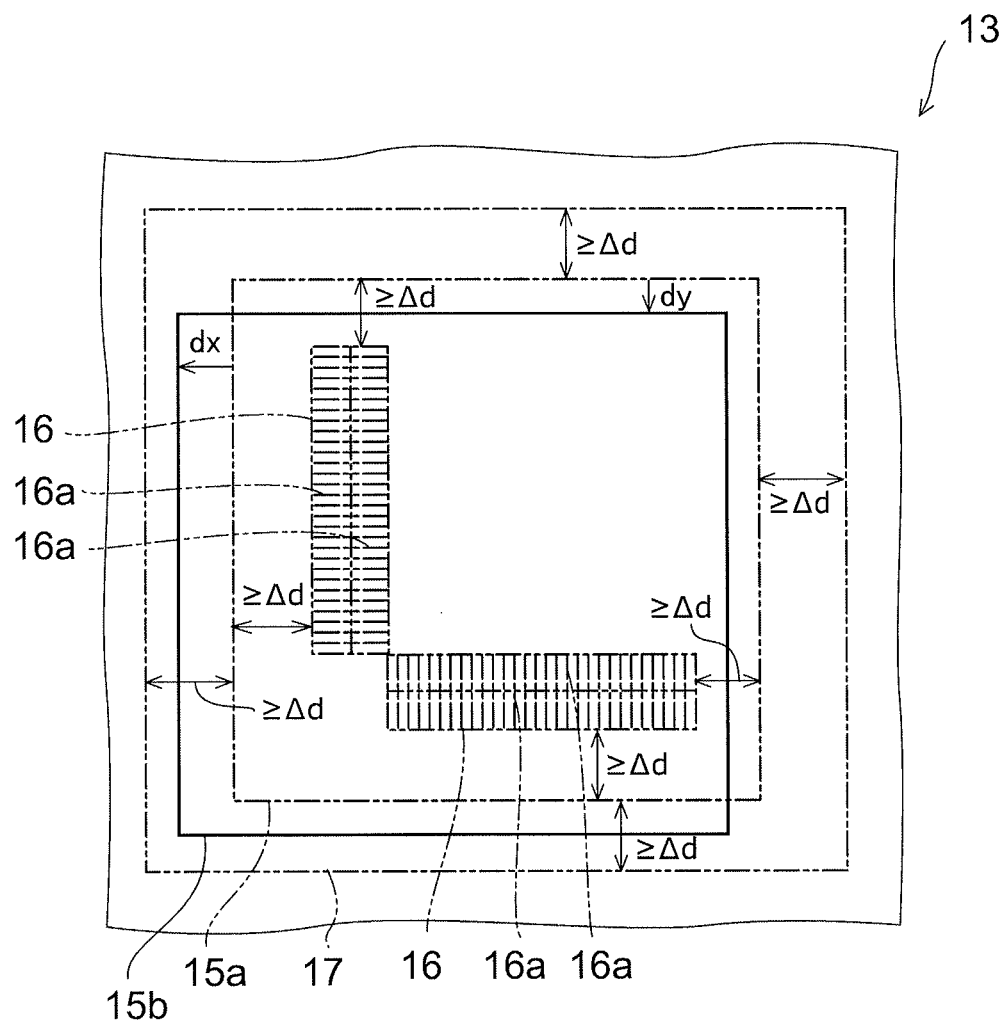
FIG. 13 is a plan view illustrating the case where the actually-measured region of the impurity implantation region is shifted from the set region.

FIG. 13 is a plan view illustrating the case where the actually-measured region of the impurity implantation region is shifted from the set region.

FIG. 13 illustrates the impurity implantation region 15 separately as a set region 15a and an actually-measured region 15b. Although there are cases where shifting occurs between the set region 15a and the actually-measured region 15b due to various factors, the shift amounts dx and dy are statistically predicted to be not more than the error Δd.

When setting the impurity implantation region 15 in the embodiment as illustrated in FIG. 7, the outer edge of the impurity implantation region 15 is separated from the region where the alignment mark is to be formed, i.e., from the outer edge of the alignment mark region 16, by a distance not less than the error Δd. Thereby, as illustrated in FIG. 13, the impurity can be reliably implanted into the alignment mark region 16 even in the case where the actually-measured region 15b is shifted from the set region 15a.

In the embodiment as illustrated in FIG. 7, the alignment mark frame 17 is set to be outside the impurity implantation region 15 at a position separated from the outer edge of the impurity implantation region 15 by a distance not less than the error Δd. Thereby, as illustrated in FIG. 13, the impurity is not implanted into the region outside the alignment mark frame 17 even in the case where the actually-measured region 15b is shifted from the set region 15a. Therefore, the control of the impurity implantation region 15 is easier. For example, the implantation of the impurity into the device region 14 can be avoided by disposing the device region 14 outside the alignment mark frame 17. As a result, the impurity implanted into the device region 14 can be prevented from diffusing into the semiconductor substrate during the imprinting to affect the characteristics of the semiconductor device.

Thus, according to the embodiment, the impurity is reliably implanted into the interior of the alignment mark region 16 and the impurity is reliably not implanted outside the alignment mark frame 17 because a margin region that has a width not less than 2 times the error Δd is provided between the alignment mark region 16 and the alignment mark frame 17. In the margin region, nothing may be disposed by design, or a pattern may be disposed in which impurity ions can be implanted without problems. The minimum width necessary for the margin region (2Δd) depends on the precision of the ion implantation apparatus 100; and the width of the margin region can be narrower as the precision of the ion implantation apparatus 100 is increased.

In the process illustrated in step S6 of FIG. 4 and FIG. 9 in the embodiment, the positions of the openings 22a of the formation aperture 22 match the positions of the set regions 15a (referring to FIG. 13) of the impurity implantation regions 15 by the position of the formation aperture 22 being such that a corner or two mutually adjacent end edges of the mesa region 13 can be viewed via the viewing window 22b when implanting the impurity. Thereby, the positions of the impurity implantation regions 15 can be designated using the corner or the two mutually adjacent end edges of the mesa region 13 as a reference. The precision when designating the positions of the impurity implantation regions 15 can be increased by using the corner or the like of the mesa region 13 as the reference because the distance from the corner of the mesa region 13 to the impurity implantation regions 15 is shorter than the distance from the end portion of the quartz substrate 21 to the impurity implantation regions 15. As a result, the impurity implantation regions 15 can be formed with good precision.

In the process illustrated in step S3 of FIG. 4 in the embodiment, an orthogonal coordinate system having the corner of the mesa region as the origin is set. Thereby, it is easier to intuitively ascertain the positions of the device region 14 and the alignment mark regions 16. As a result, for example, the setting of the impurity implantation regions 15 is easier in the process illustrated in step S4 of FIG. 4.

In the embodiment, a dedicated formation aperture 22 is prepared to match the configurations of the impurity implantation regions 15 to be formed. The openings 22a of the formation aperture 22 correspond to the impurity implantation regions 15. Thereby, all of the impurity implantation regions 15 can be formed by one impurity implantation without it being necessary to interchange the formation aperture each time the impurity implantation region 15 is formed. As a result, the time and the cost necessary for the formation of the impurity implantation regions 15 can be less than those of the case where the impurity implantation regions 15 are formed one at a time. For example, by forming four impurity implantation regions 15 by one impurity implantation, the irradiation time of the impurity ions is ¼ of that of the case where four implantations are performed one at a time.

In the embodiment, the substrate 11 is cleaned in step S8 after the implantation of the impurity in step S7 of FIG. 4 and prior to the formation of the mask film 12 in step S9. Therefore, a powerful cleaning can be performed in step S8; and the contamination due to the implantation of the impurity ions can be effectively removed. The particles adhered to the surface of the substrate 11 also can be effectively removed.

It is also conceivable to make the trenches 14a of the device pattern to be deeper than the trenches 16a of the alignment marks as a method for easier optical recognition of the alignment marks even after the replica template contacts the resist material. Thereby, the resist material no longer contacts the bottom surfaces of the trenches 16a when the replica template is pressed onto the semiconductor substrate; and it is easier to optically detect the trenches 16a. However, the throughput of the replica template undesirably decreases and the manufacturing cost undesirably increases in this method because a special process is necessary to make the trenches 16a.

It is also conceivable to fill a material other than quartz into the bottom portions of the trenches 16a. However, in such a case as well, the throughput undesirably decreases and the manufacturing cost undesirably increases because a special process is necessary.

Conversely, according to the embodiment, the device pattern and the alignment marks can be formed once by the same process without providing a dedicated process. Therefore, the productivity of the replica template is high. This effect is particularly pronounced when producing multiple replica templates.

A first modification of the first embodiment will now be described.

Figure 14:
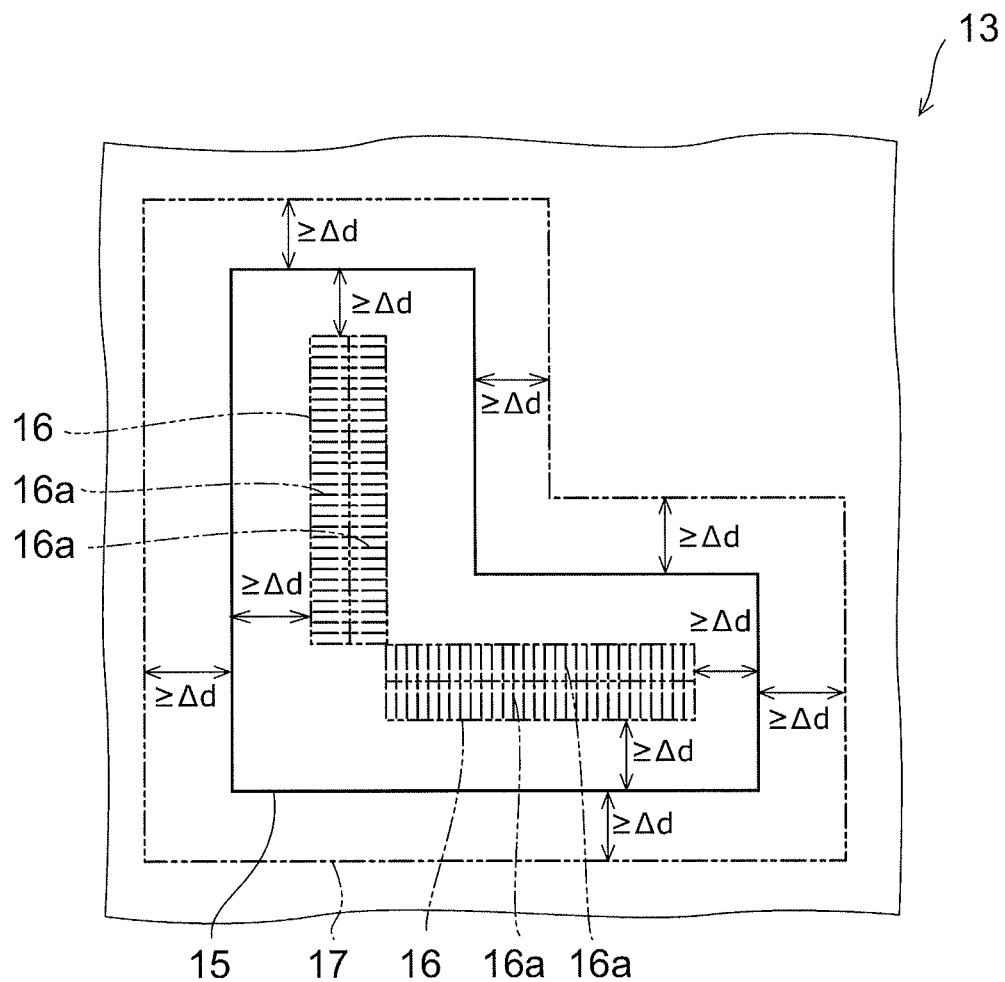
FIG. 14 is a plan view illustrating the relationship between the alignment mark region and the impurity implantation region of a first modification of the first embodiment.

FIG. 14 is a plan view illustrating the relationship between the alignment mark region and the impurity implantation region of this modification.

Figure 15:
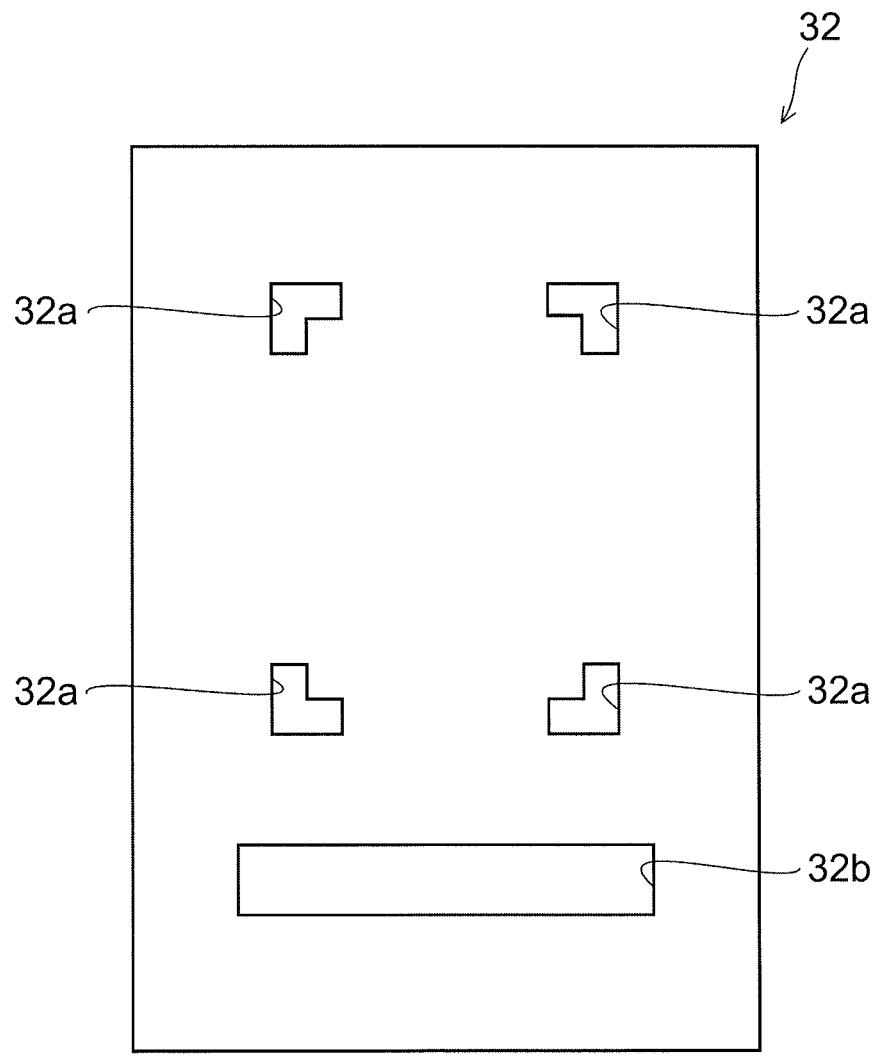
FIG. 15 is a plan view illustrating the formation aperture used in the first modification of the first embodiment.

FIG. 15 is a plan view illustrating the formation aperture used in this modification.

As illustrated in FIG. 14, the configuration of the impurity implantation region 15 of this modification differs from that of the first embodiment described above.

In the process illustrated in step S4 of FIG. 4 in this modification, the exterior form of the impurity implantation region 15 is an L shape substantially along the outer edge of the alignment mark region 16. The configuration of the alignment mark frame 17 also is an L shape along the outer edge of the impurity implantation region 15. In such a case as illustrated in FIG. 15, the formation aperture 32, in which the configurations of openings 32a for irradiating the impurity ions are L shapes corresponding to the exterior forms of the impurity implantation regions 15, is used as the formation aperture prepared in step S5 of FIG. 4. The configuration of a viewing window 32b for viewing the corner of the mesa region 13 is the same as the configuration of the viewing window 22b (referring to FIG. 8) of the formation aperture 22 of the first embodiment.

According to this modification, the surface area of the region surrounded with the alignment mark frame 17 can be reduced; and the surface area of the device region 14 can be increased by the amount of the reduction. Otherwise, the configuration, the manufacturing method, the operational effects, and the like of this modification are similar to those of the first embodiment described above.

A second modification of the first embodiment will now be described.

Figure 16:
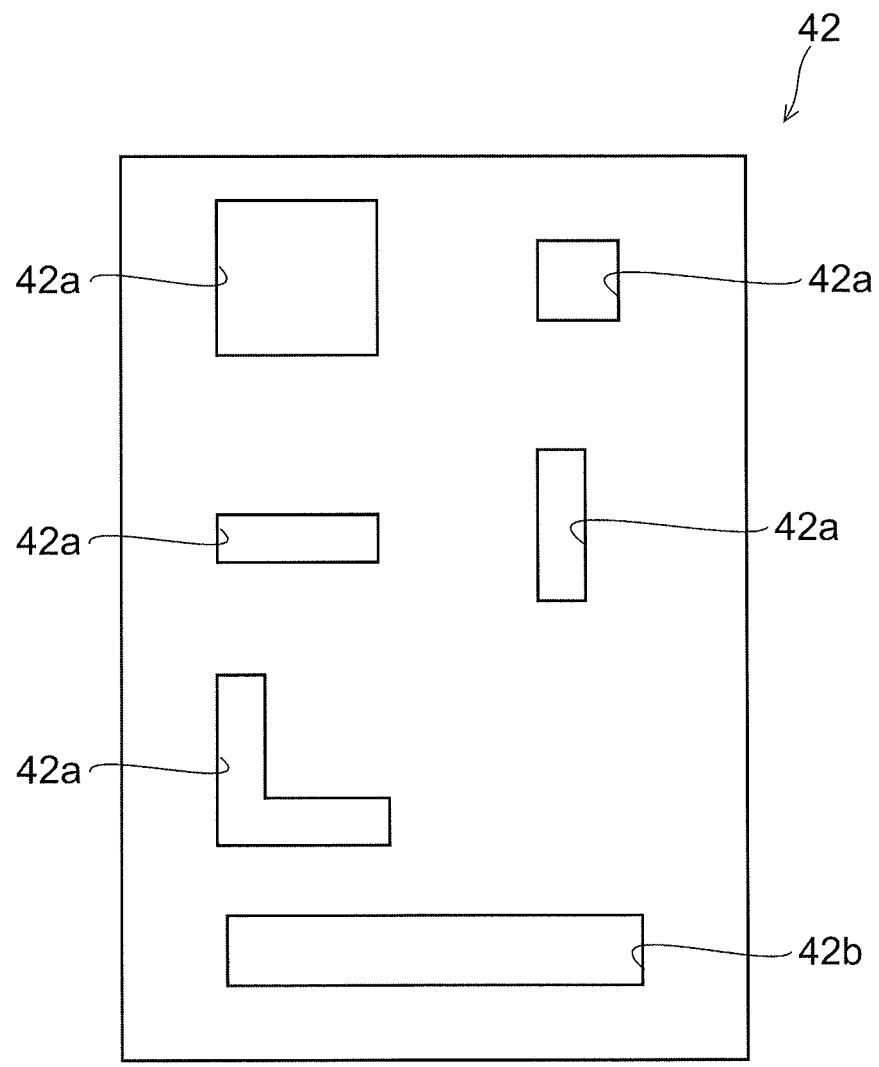
FIG. 16 is a plan view illustrating a formation aperture used in a second modification of the first embodiment.

FIG. 16 is a plan view illustrating a formation aperture used in this modification.

In this modification as illustrated in FIG. 16, a versatile formation aperture 42 is used in which openings 42a having various configurations are made. Then, one of the openings 42a is used or multiple openings 42a are used in combination to implant the impurity into one impurity implantation region 15 at a time for the multiple impurity implantation regions 15. The configuration of a viewing window 42b is the same as the configuration of the viewing window 22b (referring to FIG. 8) of the first embodiment described above.

By using the versatile formation aperture according to this modification, the cost and the time to prepare dedicated formation apertures can be reduced. Otherwise, the configuration, the manufacturing method, and the operational effects of this modification are similar to those of the first embodiment described above.

A second embodiment will now be described.

The configuration of the template substrate according to the embodiment is similar to that of the first embodiment described above.

The embodiment differs from the first embodiment described above in that the mesa region 13 is formed after the impurity is implanted.

Figure 17:
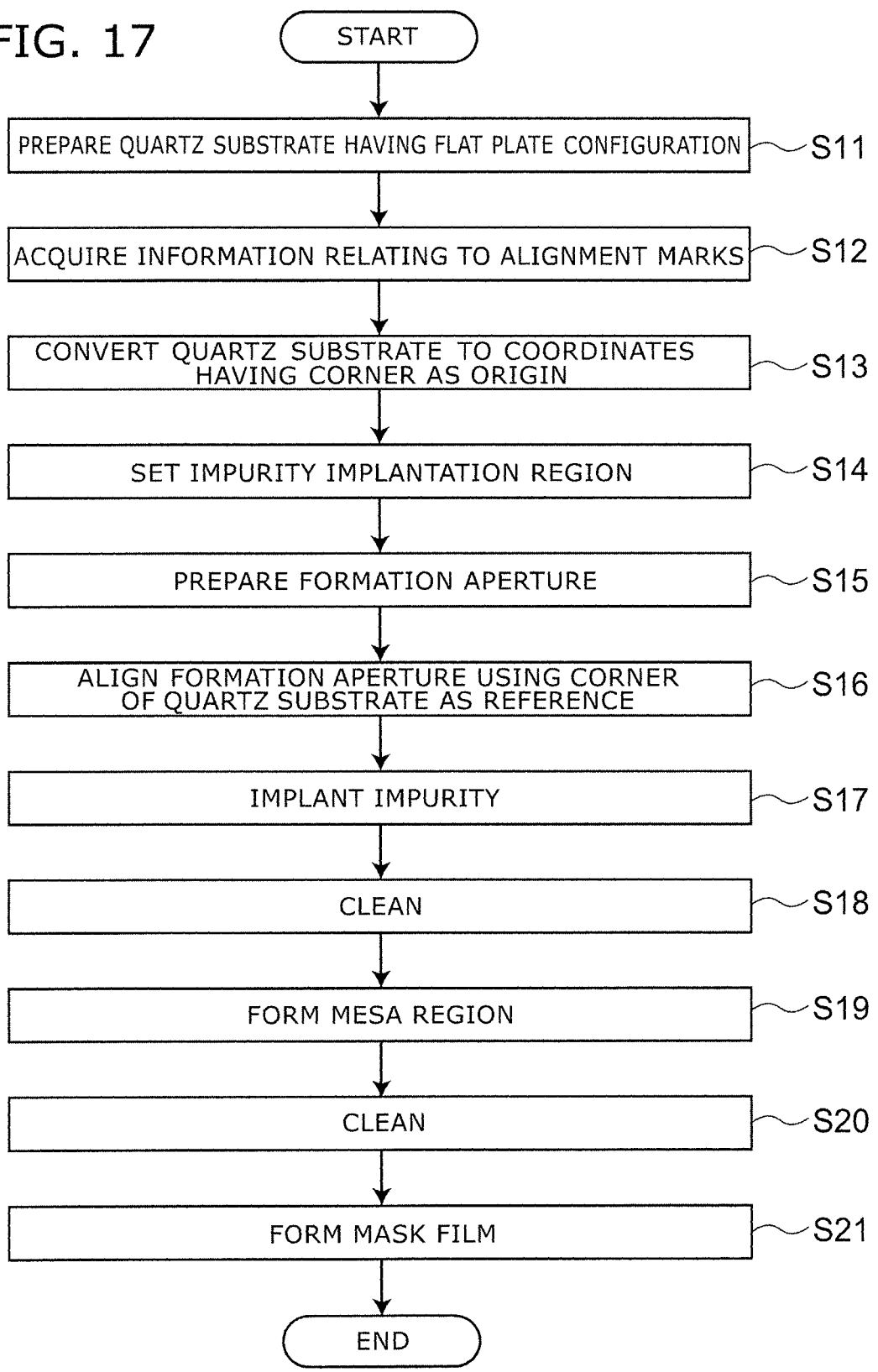
FIG. 17 is a flowchart illustrating a method for manufacturing the template substrate according to a second embodiment.

FIG. 17 is a flowchart illustrating a method for manufacturing the template substrate according to the embodiment.

Figure 18A:
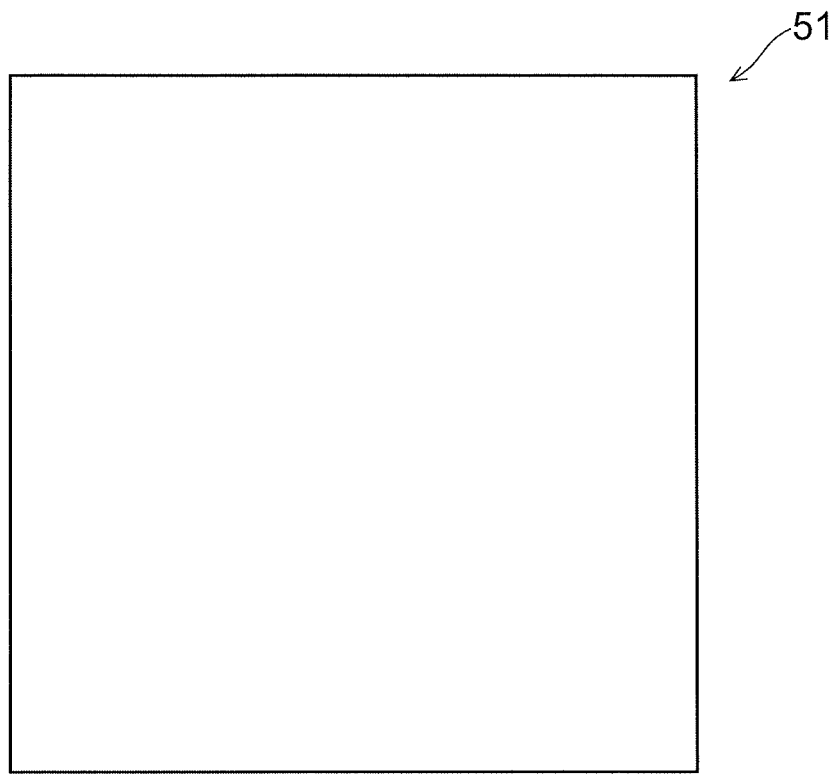
FIG. 18A is a plan view illustrating a quartz substrate.
Figure 18B:
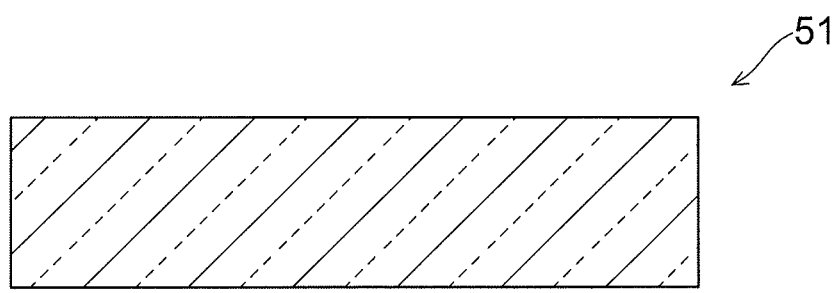
FIG. 18B is a cross-sectional view of the quartz substrate.

FIG. 18A is a plan view illustrating a quartz substrate; and FIG. 18B is a cross-sectional view of FIG. 18A.

Figure 19A:
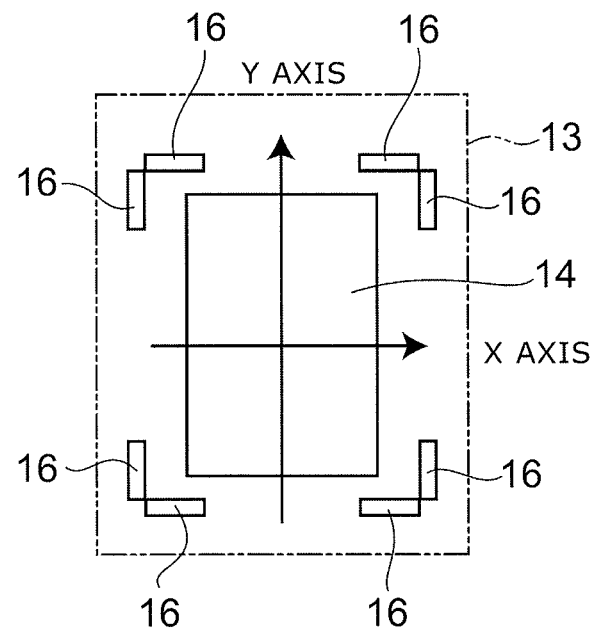
FIGS. 19A and 19B illustrate the information relating to the alignment marks, wherein FIG. 19A uses an orthogonal coordinate system having the center of the template as the origin, and FIG. 19B uses an orthogonal coordinate system having the corner of the quartz substrate as the origin.
Figure 19B:
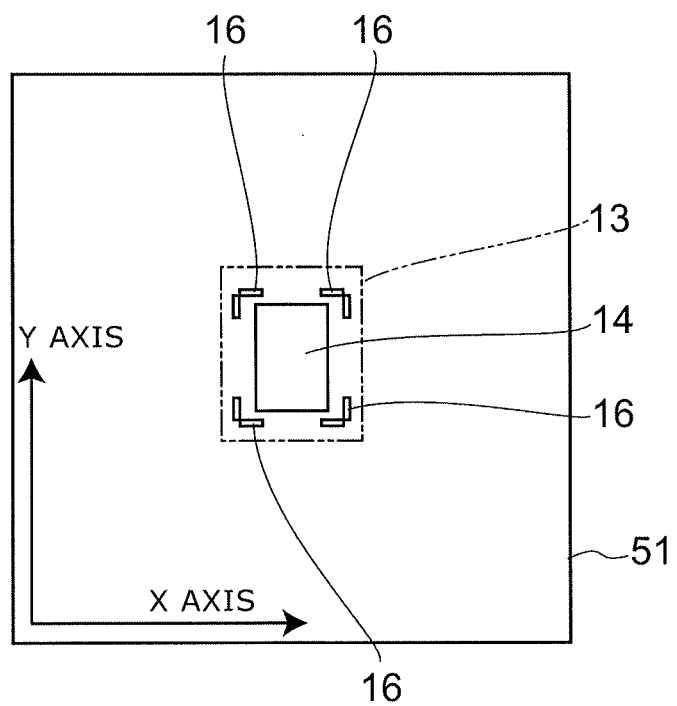

FIGS. 19A and 19B illustrate the information relating to the alignment marks. FIG. 19A uses an orthogonal coordinate system having the center of the template as the origin; and FIG. 19B uses an orthogonal coordinate system having the corner of the quartz substrate as the origin.

Figure 20:
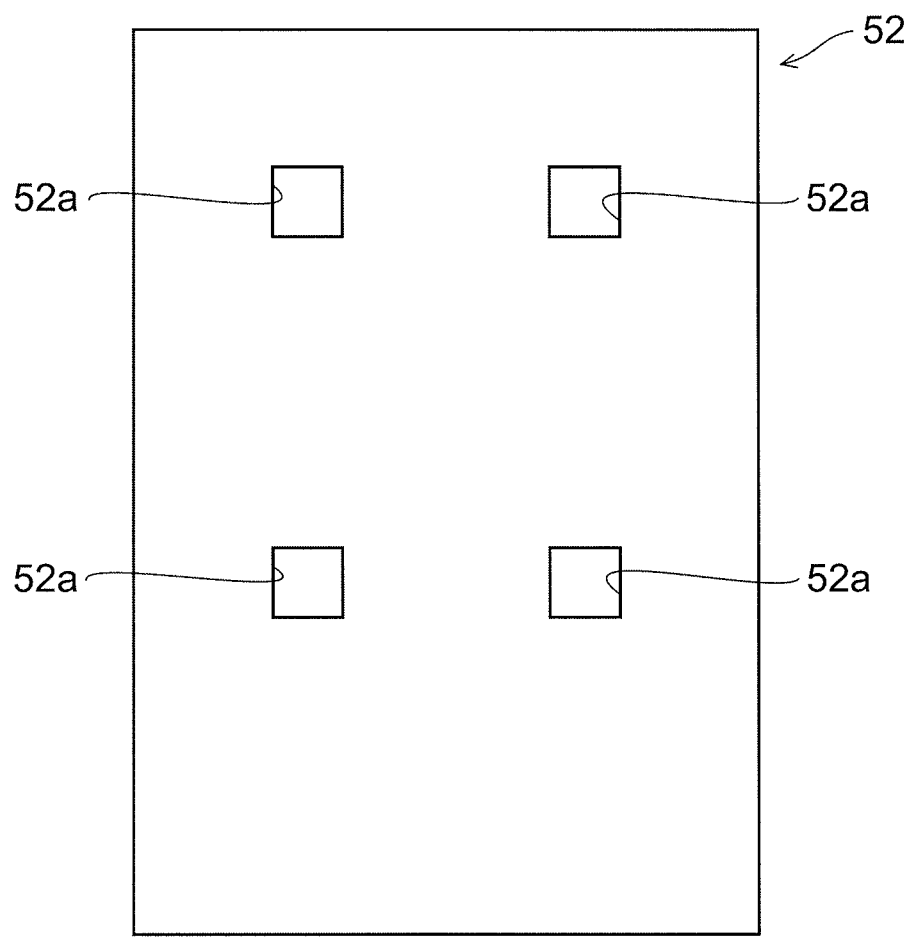
FIG. 20 is a plan view illustrating a formation aperture used in the second embodiment.

FIG. 20 is a plan view illustrating a formation aperture used in the embodiment.

Figure 21:
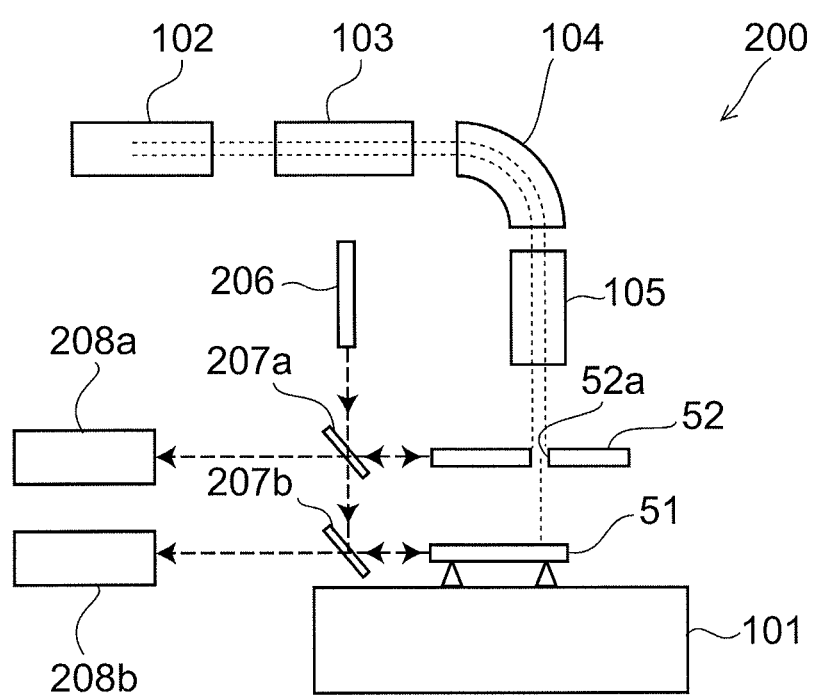
FIG. 21 illustrates an ion implantation method of the second embodiment.

FIG. 21 illustrates an ion implantation method of the embodiment.

First, as illustrated in step S11 of FIG. 17 and FIGS. 18A and 18B, a quartz substrate 51 is prepared. The quartz substrate 51 has a flat plate configuration; and the mesa region 13 (referring to FIGS. 5A and 5B) is not formed. Otherwise, the configuration and the dimensions of the quartz substrate 51 are similar to those of the quartz substrate 21 (referring to FIGS. 5A and 5B) of the first embodiment described above.

Then, as illustrated in step S12 of FIG. 17, the information relating to the alignment marks is acquired from the design information of the master template. This process is similar to step S2 (referring to FIG. 4) of the first embodiment described above.

In the design information of the master template as illustrated in FIG. 19A, normally, the positions and the like of the objects are represented using an orthogonal coordinate system having the center of the template as the origin.

Therefore, as illustrated in step S13 of FIG. 17 and FIG. 19B, this data is converted into an orthogonal coordinate system having the corner of the quartz substrate 51 as the origin. Normally, the corners of the quartz substrate often are patterned to be rounded and chamfered. Even in such a case, the orthogonal coordinate system having the corner of the quartz substrate 51 as the origin can be set by extending the planes contacting regions of the two side surfaces of the corner other than the end portions, imagining an imaginary ridgeline where these planes intersect, and by using the position of this ridgeline as viewed from above as the origin. Then, the alignment mark region 16 is specified using the orthogonal coordinate system having the corner of the quartz substrate 51 as the origin.

Then, as illustrated in step S14 of FIG. 17, the impurity implantation region 15 and the alignment mark frame 17 (referring to FIG. 7) are set based on the positional information of the alignment mark region 16 and the error Δd of the impurity implantation by methods similar to those of the first embodiment described above.

Continuing, ion implantation of the impurity is performed.

First, as illustrated in step S15 of FIG. 17 and FIG. 20, a formation aperture 52 is prepared. Although openings 52a are made to correspond to the impurity implantation regions 15 in the formation aperture 52, the viewing window for viewing the corner of the mesa region is not made.

Continuing as illustrated in FIG. 21, the formation aperture 52 and the quartz substrate 51 are mounted to an ion implantation apparatus 200.

The ion implantation apparatus 200 differs from the ion implantation apparatus 100 (referring to FIG. 9) used in the first embodiment described above in that the viewing optical system for viewing the corner of the mesa region is not provided. On the other hand, in the ion implantation apparatus 200, a position determination optical system is provided to determine the horizontal-direction positions of the formation aperture 52 and the quartz substrate 51.

Specifically, in the ion implantation apparatus 200, the viewing light source 106, the half mirror 107, and the CCD camera 108 (referring to FIG. 9) of the viewing optical system are not provided; and instead, a laser light source 206, half mirrors 207a and 207b, and laser interferometric position determination instruments 208a and 208b of the position determination optical system are provided. The half mirror 207a is disposed at a position to reflect the laser light emitted from the laser light source 206 toward the end surface of the formation aperture 52. The half mirror 207b is disposed at a position to reflect the laser light emitted from the laser light source 206 toward the end surface of the quartz substrate 51. The laser interferometric position determination instrument 208a is disposed at a position such that the laser light reflected by the end surface of the formation aperture 52 and passing through the half mirror 207a is incident on the laser interferometric position determination instrument 208a. The laser interferometric position determination instrument 208b is disposed at a position such that the laser light reflected by the end surface of the quartz substrate 51 and passing through the half mirror 207b is incident on the laser interferometric position determination instrument 208b.

Then, as illustrated in step S16 of FIG. 17 and FIG. 21, the horizontal-direction positions of the formation aperture 52 and the quartz substrate 51 are determined with high precision using the laser light source 206, the half mirrors 207a and 207b, and the laser interferometric position determination instruments 208a and 208b. Specifically, the position of the corner or the two mutually adjacent end edges is determined for the formation aperture 52 and the quartz substrate 51. Then, alignment of the quartz substrate 51 with respect to the formation aperture 52 is performed by driving the XY stage 101 based on this determination result.

Continuing as illustrated in step S17 of FIG. 17 and FIG. 21, impurity ions are selectively implanted into the quartz substrate 51. The implantation method of the impurity ions is similar to that of the first embodiment described above. Thereby, the impurity implantation regions 15 are formed in the prescribed regions of the quartz substrate 51.

Then, as illustrated in step S18 of FIG. 17, the quartz substrate 51 is cleaned.

Continuing as illustrated in step S19 of FIG. 17, the mesa region 13 is formed in the central portion of the upper surface of the quartz substrate 51 by removing the region of the upper layer portion of the quartz substrate 51 around the region including the impurity implantation regions 15. Specifically, a resist film is coated onto the entire upper surface of the quartz substrate 51. Then, exposing and developing are performed to remove the portion of the resist film disposed in the region other than the region where the mesa region 13 is to be formed. Then, wet etching is performed using hydrofluoric acid as an etchant. Thereby, the portion not covered with the resist film is etched about 30 μm. As a result, the mesa region 13 is formed by causing the region of the upper surface of the quartz substrate 51 that is covered with the resist film to protrude about 30 μm from the other region of the upper surface of the quartz substrate 51. Subsequently, the resist film is removed. Thereby, the substrate 11 is constructed.

Then, as illustrated in step S20 of FIG. 17, the substrate 11 is cleaned.

Continuing as illustrated in step S21 of FIG. 17, chromium nitride is deposited on the entire upper surface of the substrate 11 by sputtering. Thereby, the mask film 12 is formed. Thus, the template substrate 1 is manufactured.

For the portions other than those recited above, the method for manufacturing the template substrate according to the embodiment is similar to that of the first embodiment described above. The method for manufacturing the replica template using the template substrate according to the embodiment, the configuration of this replica template, and the manufacturing method and the operational effects of the semiconductor device using this replica template are similar to those of the first embodiment described above.

Next, a third embodiment will be described.

Figure 22A:
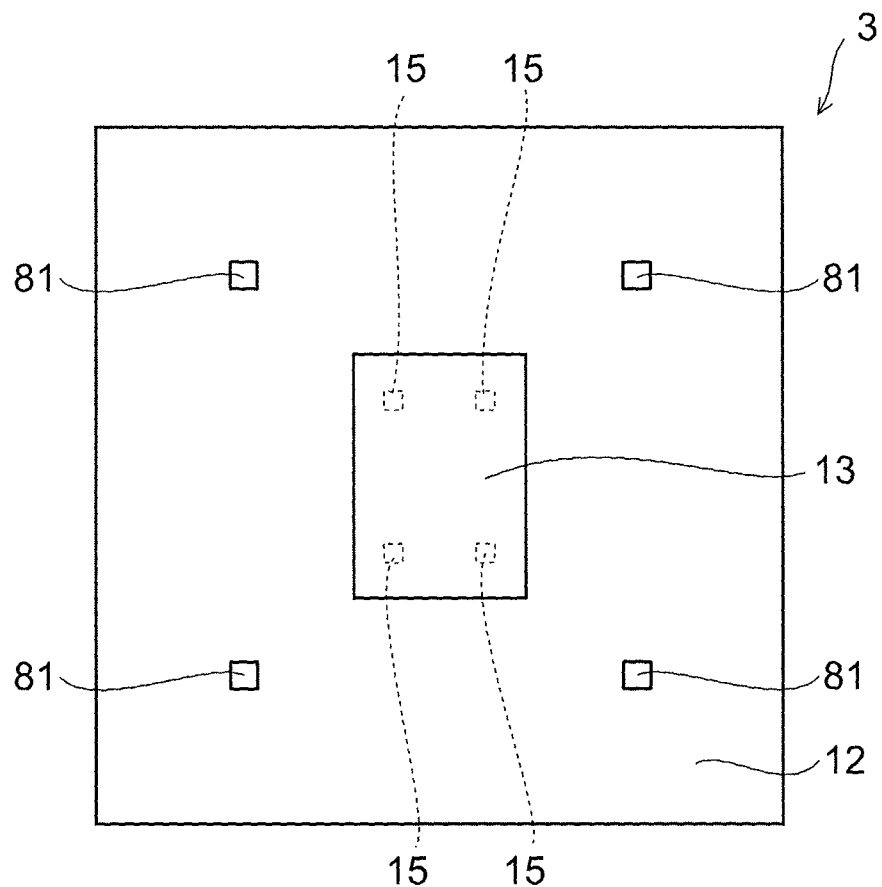
FIG. 22A is a plan view illustrating a template substrate according to a third embodiment.
Figure 22B:
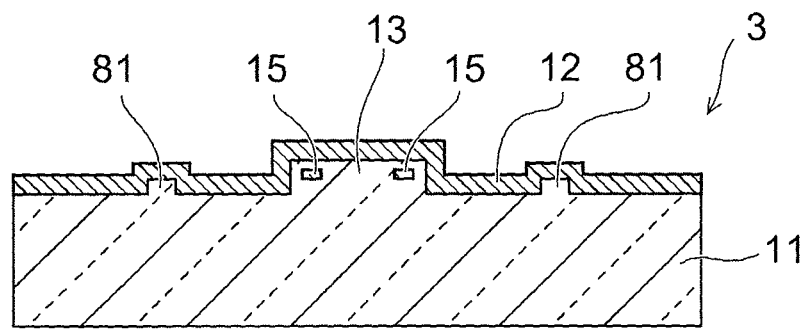
FIG. 22B is a cross-sectional view of the template substrate.

FIG. 22A is a plan view illustrating a template substrate according to a third embodiment; and FIG. 22B is a cross-sectional view of the template substrate.

Although examples are illustrated in the first embodiment described above in which the positions of the impurity implantation regions are designated by using a corner or two mutually adjacent end edges of the mesa region as a reference, and although examples are illustrated in the second embodiment described above in which the positions of the impurity implantation regions are designated by using a corner or two mutually adjacent end edges of the quartz substrate as a reference, the invention is not limited thereto.

In the embodiment, as illustrated in FIGS. 22A and 22B, reference patterns 81 are formed outside of the mesa region 13 on the upper surface 11a of the quartz substrate 11, and the impurity implantation regions 15 (referring to FIG. 1A) are designated by using the reference pattern 81 as a reference. In this case, coordinates having the corner of the reference pattern 81 as an origin may be used in the setting the impurity implantation region shown in steps S3 and S4 of FIG. 4.

For the portions other than those recited above, the template substrate and the method for manufacturing the template substrate according to the embodiment is similar to that of the first embodiment described above. The method for manufacturing the replica template using the template substrate according to the embodiment, the configuration of this replica template, and the manufacturing method and the operational effects of the semiconductor device using this replica template are similar to those of the first embodiment described above.

Although examples are illustrated in the embodiments described above in which gallium is used as the impurity implanted into the impurity implantation regions 15, the invention is not limited thereto. For example, xenon, antimony, argon, indium, silicon, arsenic, or lead may be used as the impurity. In particular, antimony is favorable as the impurity because antimony effectively reduces the transmittance of visible light of the quartz substrate, reacts with the etching gas and is discharged when the quartz substrate is etched using the etching gas including fluorine (referring to step S66 of FIG. 11 and FIG. 12F) and thereby does not cause contamination, has good cleanability, and particularly has excellent resistance to oxygen plasma.

Although examples are illustrated in the embodiments described above in which a replica template is constructed by transferring a pattern of a master template onto a template substrate according to the embodiments, the invention is not limited thereto. The pattern may be formed directly on the template substrate without using the master template. In such a case, the device pattern and the alignment marks can be formed, for example, by electron-beam lithography and developing in the process illustrated in step S63 of FIG. 11 and FIG. 12C.

Although examples are illustrated in the embodiments described above in which a total of four alignment marks are formed at the corners of the mesa region, the invention is not limited thereto. For example, only one alignment mark may be formed; or five or more alignment marks may be formed. The alignment marks may be formed at the end portions of the mesa region instead of the corners. In such a case as well, it is favorable for the impurity implantation region 15 to be formed in the entire region where the alignment mark is to be formed. According to the embodiments described above, a template substrate and a method for manufacturing the template substrate can be realized to construct a template for imprinting that can perform alignment with good precision.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A template substrate, comprising:
   a substrate including a mesa region and a surrounding region, the mesa region and the surrounding region being made of quartz, the mesa region being formed in a central portion of an upper surface of the substrate, the surrounding region being formed around the mesa region of the upper surface of the substrate, the mesa region protruding more than the surrounding region, an impurity being introduced into an upper layer portion of a partial region of a peripheral portion of the mesa region, a concentration profile along a vertical direction of the impurity of the partial region having a maximum value at a position within 60 nm of the upper surface of the substrate; and
   a mask film provided on the upper surface of the substrate.

2. The template substrate according to claim 1, wherein:
   a configuration of the mesa region is a rectangle as viewed from above; and
   the partial region is disposed at least at each corner of the mesa region.

3. The template substrate according to claim 1, wherein the substrate includes only one of the mesa region.

4. The template substrate according to claim 1, wherein a template made of the template substrate is used for making a pattern by pressing onto a resist material,
   a difference between a refractive index of the upper layer portion of the partial region and a refractive index of the resist material is higher than a difference between a refractive index of the quartz and the refractive index of the resist material.

5. The template substrate according to claim 1, wherein the mesa region and the surrounding region are light transmitting.

6. The template substrate according to claim 1, wherein the impurity being introduced into upper layer portions of four partial regions of the peripheral portion of the mesa region, and each of the four partial regions is disposed at each of corners of the mesa region.

7. The template substrate according to claim 1, wherein the impurity is introduced with a shallow depth of not more than 60 nm of the upper surface of the substrate.

8. The template substrate according to claim 7, wherein the impurity is not introduced with a deep depth of more than 60 nm of the upper surface of the substrate.

9. A template for nanoimprinting, comprising a substrate, the substrate including:
   a mesa region formed in a central portion of an upper surface of the substrate, the mesa region including an impurity implantation region in an upper layer portion of a partial region of a peripheral portion of the mesa region, a trench made in the partial region, the trench being deeper than a lower surface of the impurity implantation region; and
   a surrounding region formed around the mesa region of the upper surface of the substrate, the mesa region protruding more than the surrounding region, and the mesa region and the surrounding region being made of quartz.

10. The template according to claim 9, wherein a concentration profile along a vertical direction of the impurity of the partial region has a maximum value at a position higher than a position where a bottom surface of the trench is located.

11. The template according to claim 9, wherein the mesa region and the surrounding region are light transmitting.

12. The template according to claim 9, wherein the impurity being introduced into upper layer portions of four partial regions of the peripheral portion of the mesa region, and each of the four partial regions is disposed at each of corners of the mesa region.

13. The template according to claim 9, wherein the impurity is introduced with a shallow depth of not more than 60 nm of the upper surface of the substrate.

14. The template according to claim 13, wherein the impurity is not introduced with a deep depth of more than 60 nm of the upper surface of the substrate.

15. A template substrate, comprising:
a substrate including a mesa region and a surrounding region, the mesa region and the surrounding region being made of quartz, the mesa region being formed in a central portion of an upper surface of the substrate, the surrounding region being formed around the mesa region of the upper surface of the substrate, the mesa region protruding more than the surrounding region, an impurity being introduced into an upper layer portion of a partial region of a peripheral portion of the mesa region; and
a mask film provided on the upper surface of the substrate
wherein a template made of the template substrate is used for making a pattern by pressing the template onto a resist material, and
a difference between a refractive index of the upper layer portion of the partial region and a refractive index of the resist material is higher than a difference between a refractive index of the quartz and the refractive index of the resist material.

16. The template substrate according to claim 15, wherein the mesa region and the surrounding region are light transmitting.

17. The template substrate according to claim 15, wherein the impurity being introduced into upper layer portions of four partial regions of the peripheral portion of the mesa region, and each of the four partial regions is disposed at each of corners of the mesa region.

18. The template substrate according to claim 15, wherein the impurity is introduced with a shallow depth of not more than 60 nm of the upper surface of the substrate.

19. The template substrate according to claim 18, wherein the impurity is not introduced with a deep depth of more than 60 nm of the upper surface of the substrate.

* * * * *